(12) United States Patent
Iwanaga et al.

(10) Patent No.: US 10,008,405 B2
(45) Date of Patent: Jun. 26, 2018

(54) EXPANSION METHOD, METHOD FOR MANUFACTURING SEMICONDUCTOR DEVICE, AND SEMICONDUCTOR DEVICE

(71) Applicant: HITACHI CHEMICAL COMPANY, LTD., Tokyo (JP)

(72) Inventors: Yukihiro Iwanaga, Chiba (JP); Kouji Suzumura, Ichihara (JP); Tatsuya Sakuta, Ichihara (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days. days.

(21) Appl. No.: 14/655,079

(22) PCT Filed: Dec. 26, 2013

(86) PCT No.: PCT/JP2013/084879
§ 371 (c)(1),
(2) Date: Jun. 24, 2015

(87) PCT Pub. No.: WO2014/104189
PCT Pub. Date: Jul. 3, 2014

(65) Prior Publication Data
US 2015/0348821 A1 Dec. 3, 2015

(30) Foreign Application Priority Data
Dec. 26, 2012 (JP) ................. 2012-282785

(51) Int. Cl.
*H01L 21/683* (2006.01)
*H01L 21/78* (2006.01)
(Continued)

(52) U.S. Cl.
CPC ......... *H01L 21/6836* (2013.01); *H01L 21/68* (2013.01); *H01L 21/78* (2013.01);
(Continued)

(58) Field of Classification Search
CPC ....... H01L 21/68; H01L 21/78; H01L 21/683; H01L 23/00; H01L 21/50; H01L 21/75
(Continued)

(56) References Cited

U.S. PATENT DOCUMENTS 8,545,979 B2 10/2013 Kita et al.
2006/0128065 A1* 6/2006 Inada ................... C09J 7/0242
438/118
(Continued)

FOREIGN PATENT DOCUMENTS

CN 102676093 A 9/2012
JP 2005-019962 A 1/2005
(Continued)

OTHER PUBLICATIONS

International Search Report for International Application No. PCT/JP2013/084879 dated Apr. 1, 2014.
(Continued)

*Primary Examiner* — Bo Fan
(74) *Attorney, Agent, or Firm* — Fitch, Even, Tabin & Flannery, LLP

(57) ABSTRACT

An embodiment of the present invention relates to an expansion method comprising: a step (I) of preparing a laminate having a semiconductor wafer in which modified sections have been formed along intended cutting lines, a die bonding film and a dicing tape, a step (IIA) of expanding the dicing tape with the laminate in a cooled state, a step (IIB) of loosening the expanded dicing tape, and a step (IIC) of expanding the dicing tape with the laminate in a cooled state, dividing the semiconductor wafer and the die bonding film into chips along the intended cutting lines, and widening the spaces between the chips.

7 Claims, 15 Drawing Sheets

(51) Int. Cl.
  *H01L 23/00* (2006.01)
  *H01L 21/68* (2006.01)
(52) U.S. Cl.
  CPC .............. *H01L 24/27* (2013.01); *H01L 24/29* (2013.01); *H01L 2221/68327* (2013.01); *H01L 2221/68336* (2013.01); *H01L 2221/68377* (2013.01); *H01L 2221/68381* (2013.01)
(58) Field of Classification Search
  USPC ................................. 257/798; 438/462, 118
  See application file for complete search history.

(56) References Cited

U.S. PATENT DOCUMENTS

| | | | | |
|---|---|---|---|---|
| 2008/0286594 | A1* | 11/2008 | Inada | C09J 7/0242 428/523 |
| 2012/0231583 | A1 | 9/2012 | Onishi et al. | |

FOREIGN PATENT DOCUMENTS

| | | | | |
|---|---|---|---|---|
| JP | 2005057158 | A | | 3/2005 |
| JP | 2005109044 | A | | 4/2005 |
| JP | 2009253071 | | * | 10/2009 ............. H01L 21/78 |
| JP | 2009253071 | A | | 10/2009 |
| JP | 2009277837 | A | | 11/2009 |
| JP | 2011-046963 | A | | 3/2011 |
| JP | 2012204747 | A | | 10/2012 |
| TW | 200530361 | A | | 9/2005 |
| TW | 201040242 | A | | 11/2010 |
| TW | 201041028 | A | | 11/2010 |
| TW | 201130943 | A | | 9/2011 |

OTHER PUBLICATIONS

Office Action in counterpart Taiwan Appln. No. 102148488 dated Oct. 12, 2015 with English translation.
Office Action in counterpart Taiwan Appln. No. 102148488 dated Oct. 12, 2015.
Notice of Preliminary Rejection dated Feb. 8, 2017, in Korean Patent Application No. 10-2015-7016202, together with English language translation thereof.
Office Action dated Jul. 12, 2016, for Japanese Application No. 2014-554543.
Office Action dated Aug. 29, 2016, for Chinese Application No. 201380067782.4, together with English language translation thereof.
Office Action dated May 3, 2017, in Chinese Application No. 201380067782.4, together with English language translation thereof.

* cited by examiner (I)

(IIA)

(IIB)

(IIC)

(Ia)

(Ib)

(Ic)

(IIa)

(Ia')

(Ib')

(Ic')

(IIa')

(IIb')

(IIc')

EXPANSION METHOD, METHOD FOR MANUFACTURING SEMICONDUCTOR DEVICE, AND SEMICONDUCTOR DEVICE

TECHNICAL FIELD

Embodiments of the present invention relate to an expansion method, a method for manufacturing a semiconductor device, and a semiconductor device.

BACKGROUND ART

In recent years, remarkable progress has been made in terms of reducing the thickness and size of semiconductor chips. In particular, the semiconductor chips installed in IC cards such as memory cards and smart cards require a chip having a thickness of not more than 75 μm and a size of not more than 10 mm×10 mm. It is thought that as the demand for IC cards increases in the future, the requirement for small, thin chips will continue to grow.

Semiconductor chips are usually obtained by processing a semiconductor wafer to a prescribed thickness in a back grinding step or etching step or the like, and subsequently dividing the semiconductor wafer into individual chips in a dicing step. In the dicing step, a blade cutting method in which the semiconductor wafer is cut with a dicing blade is generally used. In the blade cutting method, minute defects (also referred to as "chipping") are sometimes formed on the semiconductor chip as a result of the cutting resistance generated during the cutting process. This occurrence of chipping not only impairs the external appearance of the semiconductor chip, but depending on the degree of chipping, can sometimes cause damage to the circuit pattern on the semiconductor chip, and has recently been recognized as an important problem. In semiconductor chips that have been reduced in thickness and size, the permissible level of chipping is particularly stringent. It is expected that in the future, as further reductions are made in the thickness and size of semiconductor chips, the problem of chipping will become more critical.

The stealth dicing method is another method that can be used in the dicing step. The stealth dicing method is a method particularly suited for cutting ultra thin semiconductor wafers, and it is known that the stealth dicing method is able to suppress chipping. The stealth dicing method is performed in the following manner.

In one specific example of the stealth dicing method, first, a laser beam is irradiated onto the semiconductor wafer so that the focal point of the laser beam is located inside the interior of the semiconductor wafer, thereby forming a brittle modified section inside the semiconductor wafer as a result of multiphoton absorption. By moving the irradiation position of the laser beam along the lines which indicate the positions where the semiconductor wafer is to be divided into individual semiconductor chips (also referred to as "intended cutting lines"), modified sections (also referred to as "dicing lines") can be formed along the intended cutting lines. Subsequently, a dicing tape is affixed to the rear surface of the semiconductor wafer (the surface on which no circuit is formed), and the dicing tape is then expanded. As a result, external stress is applied to the semiconductor wafer, and the semiconductor wafer cleaves along the intended cutting lines, thus dividing the wafer into individual semiconductor chips and widening the spaces between the semiconductor chips.

The step of expanding the dicing tape is usually called an expansion step. The expansion step is a step that is generally conducted regardless of whether the dicing step is performed using the blade dicing method or the stealth dicing method. When the dicing step is performed using the blade dicing method, the semiconductor wafer is divided into semiconductor chips using the dicing blade, and the expansion step is then performed to widen the spaces between the semiconductor chips. In this case, the expansion step is conducted mainly for the purpose of facilitating pickup of the semiconductor chips. However, when the dicing step is performed using the stealth dicing method, then as described above, the expansion step functions as a step for dividing the semiconductor wafer in which the dicing lines have been formed into individual semiconductor chips. Further, in addition, the expansion step also functions as a step for widening the spaces between the divided semiconductor chips. Examples of the methods and apparatus used in the expansion step are disclosed in Patent Literatures 1 to 3 and the like.

CITATION LIST

Patent Literature

PLT 1: JP 2005-109044 A
PLT 2: JP 2005-057158 A
PLT 3: JP 2009-253071 A

SUMMARY OF INVENTION

Technical Problem

Conventionally, the bonding between semiconductor chips and adherends such as support members has mainly used silver paste. However, when silver paste is used with a semiconductor chip that has been reduced in thickness and size, paste protrusion, difficulties in controlling the paste thickness, wire bonding problems caused by tilting of the semiconductor chip, and the occurrence of voids and the like are issues which cannot be ignored. These issues are particularly severe in modern semiconductor devices that require high integration of the semiconductor chips and miniaturization of support members.

Accordingly, in recent years, film-like die bonding materials known as die bonding films have increasingly been used for the bonding of semiconductor chips and adherends. When a die bonding film is used, the die bonding film and a dicing tape are affixed in that order to the rear surface of the semiconductor wafer. By subsequently cutting the semiconductor wafer and the die bonding film at the same time during the dicing step, semiconductor chips with a die bonding film affixed thereto are obtained. The thus obtained semiconductor chips can be bonded to adherends via the die bonding film.

When the semiconductor wafer and the die bonding film are cut using the stealth dicing method, the expansion step requires that the die bonding film is cut together with the semiconductor wafer in which the dicing lines have been formed. By performing the expansion step, the semiconductor wafer and the die bonding film are then divided into individual semiconductor chips (also referred to as "chips") each having a die bonding film affixed thereto.

In light of these circumstances, an embodiment of the present invention has an object of providing an expansion method that enables a semiconductor wafer and a die bonding film to be cut favorably. Further, by employing this expansion method, other embodiments of the present invention have objects of providing a method for manufacturing a semiconductor device which enables efficient manufacture of the semiconductor device, and a semiconductor device obtained using this manufacturing method.

Solution to Problem

One embodiment of the present invention relates to an expansion method comprising: a step (I) of preparing a laminate having a semiconductor wafer in which modified sections have been formed along intended cutting lines, a die bonding film and a dicing tape; a step (IIA) of expanding the dicing tape with the laminate in a cooled state; a step (IIB) of loosening the expanded dicing tape; and a step (IIC) of expanding the dicing tape with the laminate in a cooled state, dividing the semiconductor wafer and the die bonding film into chips along the intended cutting lines, and widening the spaces between the chips.

Further, another embodiment of the present invention relates to a method for manufacturing a semiconductor device comprising: a step (I) of preparing a laminate having a semiconductor wafer in which modified sections have been formed along intended cutting lines, a die bonding film and a dicing tape; a step (II) of expanding the dicing tape, dividing the semiconductor wafer and the die bonding film into chips along the intended cutting lines, and widening the spaces between the chips; a step (III) of picking up a chip from the dicing tape; and a step (IV) of die bonding the chip to an adherend, wherein the step (I) and the step (II) are performed using the expansion method of the embodiment described above.

Yet another embodiment of the present invention relates to a semiconductor device having an adherend, and a chip bonded to the adherend, wherein the semiconductor device is manufactured using the method for manufacturing a semiconductor device according to the embodiment described above.

The disclosure of the present application is related to the subject matter disclosed in prior Japanese Application 2012-282785 filed on Dec. 26, 2012, the entire contents of which are incorporated herein by reference.

Advantageous Effects of Invention

One embodiment of the present invention is able to provide an expansion method that enables a semiconductor wafer and a die bonding film to be cut favorably. Further, other embodiments of the present invention are able to provide a method for manufacturing a semiconductor device that enables efficient manufacture of the semiconductor device, and a semiconductor device obtained using this manufacturing method.

DESCRIPTION OF EMBODIMENTS

Figure 1:
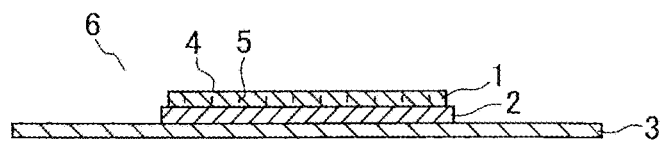
FIG. 1 is a schematic diagram illustrating one embodiment of the expansion method.
Figure 1:
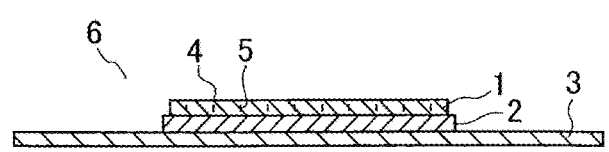
Figure 1:
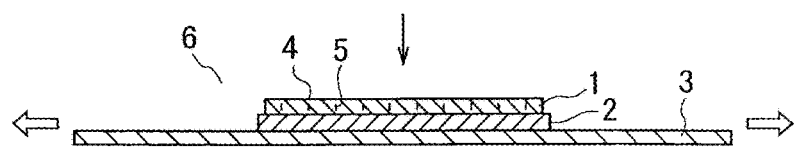
Figure 1:
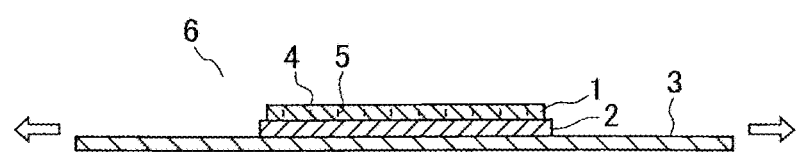
Figure 1:
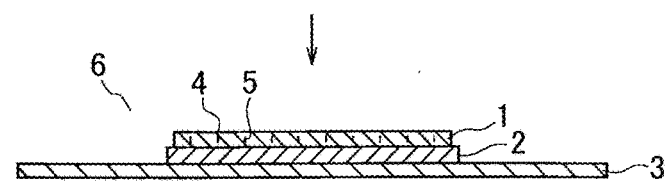
Figure 1:
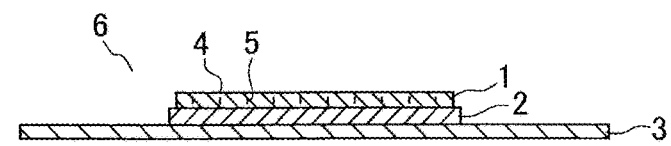
Figure 1:
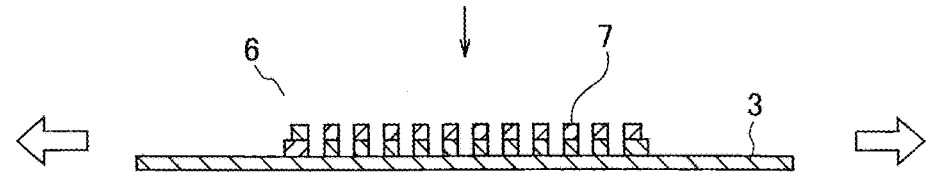

Embodiments of the present invention are described below using the drawings. In the drawings, the same members are labeled with the same numbers, and duplicate descriptions are omitted.

First Embodiment

The first embodiment relates to an expansion method for cutting a semiconductor wafer and a die bonding film along intended cutting lines to divide the wafer into chips, and expanding the spaces between the chips.

Figure 18:
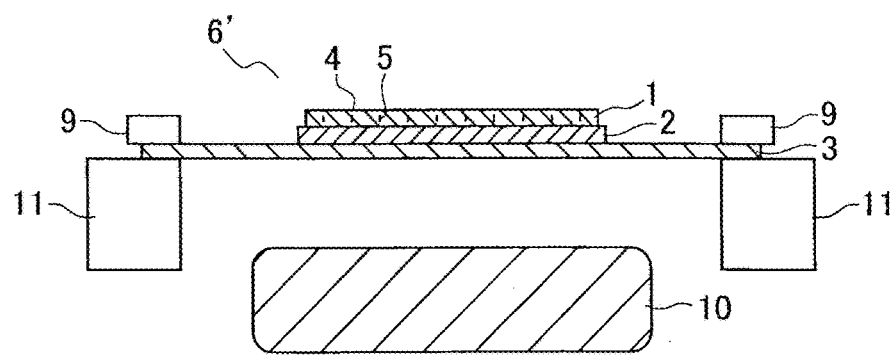
FIG. 18 is a schematic diagram illustrating one example of a conventional expansion method.
Figure 18:
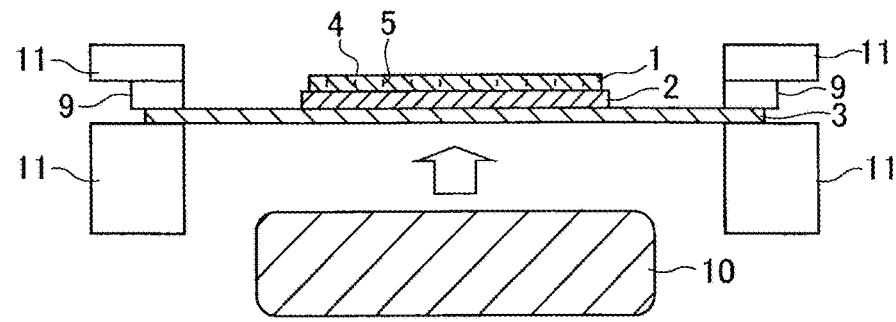
Figure 18:
Figure 18:
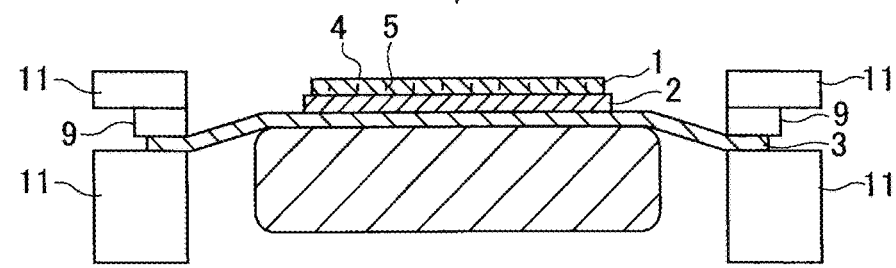

When cutting a semiconductor wafer and a die bonding film, the expansion step is generally performed at low temperature from the viewpoint of improving the fracture properties of the die bonding film. However, even when the expansion step is performed at low temperature, the semiconductor wafer and the die bonding film can sometimes not be cut. FIG. 18 is a schematic diagram illustrating one example of a conventional expansion method, and shows an example in which a semiconductor wafer 1 and a die bonding film 2 are not cut. In FIG. 18, a dicing tape 3 to which the semiconductor wafer 1 and the die bonding film 2 have been laminated is expanded by pushing the dicing tape 3 upward under cooling using an expansion stage 10 fitted with a cooling device.

The inventors of the present invention thought that one of the reasons for failure to cut the semiconductor wafer and the die bonding film was due to the extensibility of the dicing tape in a low-temperature state. The extensibility of the dicing tape decreases at low temperature, and it is thought that the amount of expansion of the dicing tape becomes insufficient, resulting in a reduction in the external force that can be applied to the semiconductor wafer and the die bonding film. Accordingly, the expansion method of the present embodiment is provided as a method for improving the extensibility of the dicing tape in a low-temperature state.

In other words, by performing the expansion step at low temperature, although the fracture properties of the die bonding film improve, the extensibility of the dicing tape decreases, and therefore a satisfactory external force cannot be imparted to the semiconductor wafer and the die bonding film. In contrast, the present embodiment is an expansion method in which the extensibility of the dicing tape in a low-temperature state is improved by a simple method, thus enabling the semiconductor wafer and the die bonding film to be cut favorably.

The first embodiment relates to an expansion method comprising: a step (I) of preparing a laminate having a semiconductor wafer in which modified sections have been formed along intended cutting lines, a die bonding film and a dicing tape; a step (IIA) of expanding the dicing tape with the laminate in a cooled state; a step (IIB) of loosening the expanded dicing tape; and a step (IIC) of expanding the dicing tape with the laminate in a cooled state, dividing the semiconductor wafer and the die bonding film into chips along the intended cutting lines, and widening the spaces between the chips. FIG. 1 is a schematic diagram illustrating the first embodiment. The laminate is shown in a cross-sectional view. Unless specifically stated otherwise, the description relating to the first embodiment, where applicable, also applies to the other embodiments described below.

The present embodiment has the steps (I) to (IIC) in this order. The embodiment may also include other optional steps before or after each step, such as a step of detaching a protective sheet, a transport step, or an inspection or verification step. The steps (IIA) to (IIC) are preferably performed consecutively.

(Step (I))

As illustrated in FIG. 1, first, a laminate 6 having a semiconductor wafer 1 in which modified sections 5 have been formed along intended cutting lines 4, a die bonding film 2 and a dicing tape 3 is prepared (step (I)). Conventionally known methods can be used as the method for obtaining the laminate 6. One example of the method for obtaining the laminate 6 is described below.

Examples of the semiconductor wafer include wafers formed from silicon such as single-crystal silicon or polycrystalline silicon, various ceramics, sapphire, or compound semiconductors such as gallium nitride or gallium arsenide. Other semiconductor wafers besides those listed above can also be used.

There are no particular limitations on the thickness or size of the semiconductor wafer. From the viewpoint of reducing the occurrence of chipping, the thickness of the semiconductor wafer is, for example, preferably 25 μm or greater. Further, from the viewpoint of enabling package miniaturization, the thickness of the semiconductor wafer is, for example, preferably not more than 100 μm, more preferably not more than 75 μm, and still more preferably 50 μm or less. From the viewpoint of improving productivity, the diameter of the semiconductor wafer is, for example, preferably at least 200 mm, and more preferably 300 mm or greater.

The "intended cutting lines" refer to the lines along which it is intended to divide the semiconductor wafer. Chips are obtained by cutting the semiconductor wafer and the die bonding film along these intended cutting lines. The thus obtained "chips" include a semiconductor chip and an individual piece of the die bonding film bonded to the semiconductor chip.

Figure 2:
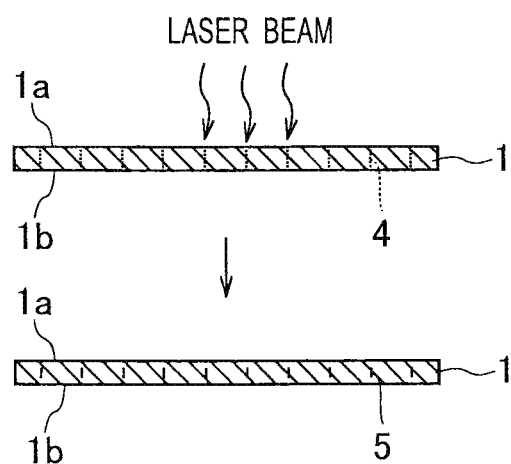
FIG. 2 is a schematic diagram illustrating one embodiment of a step of obtaining a semiconductor wafer in which modified sections have been formed along intended cutting lines.

Modified sections are formed in advance in the semiconductor wafer along the intended cutting lines. These "modified sections" are preferably brittle modified sections formed by irradiating a laser beam onto the semiconductor wafer so that the focal point of the laser beam is located inside the interior of the semiconductor wafer. FIG. 2 is a schematic diagram illustrating one embodiment of the step of forming the modified sections 5 along the intended cutting lines 4 in the semiconductor wafer 1. The irradiation of the laser beam onto the semiconductor wafer 1 may be performed from the upper surface of the semiconductor wafer 1, namely the surface 1a on which a circuit is formed, or may be performed from the rear surface of the semiconductor wafer, namely the surface 1b on which no circuit is formed.

The method used for forming the modified sections in the interior of the semiconductor wafer 1 may employ the method disclosed in JP 2002-192370 A or JP 2003-338467 A. Examples of the apparatus that can be used in the laser beam irradiation include a laser dicing apparatus "Mahoh Dicing Machine" (manufactured by Tokyo Seimitsu Co., Ltd.) and a laser dicing saw "DFL7360" (manufactured by DISCO Corporation).

Examples of the conditions used when using the laser dicing apparatus "Mahoh Dicing Machine" (manufactured by Tokyo Seimitsu Co., Ltd.) are shown below. By irradiating the laser beam onto the upper surface of the semiconductor wafer under the conditions described below, with the focal point of the laser beam located inside the interior of the semiconductor wafer, and then moving the laser beam along the intended cutting lines, modified sections can be formed inside the semiconductor wafer. The modified sections are preferably melt treatment regions formed by localized heating and melting of the interior of the semiconductor wafer upon multiphoton absorption.

(Laser Processing Conditions)

(A) Semiconductor wafer: silicon wafer (thickness 75 μm, outer diameter 12 inches (300 mm))

(B) Laser beam source: semiconductor laser-excited Nd:YAG laser

Wavelength: 1064 nm

Laser spot surface area: $3.14 \times 10^{-8}$ cm$^2$

Oscillation form: Q-switch pulse

Repeat frequency: 100 kHz

Pulse width: 30 ns

Output: 20 μJ/pulse

Laser beam quality: TEM00

Polarization characteristics: linear polarization (C) Condenser lens magnification: 50-fold

NA: 0.55

Transmittance of laser beam wavelength: 60%

(D) Movement speed of mount on which semiconductor wafer is mounted: 100 mm/second There are no particular limitations on the spacing between the intended cutting lines. The obtained chips will have a size determined by the spacing between the intended cutting lines.

The die bonding film is an adhesive film that is used when mounting a semiconductor chip to a semiconductor chip-mounting support member such as a lead frame or an organic substrate, or when laminating semiconductor chips together.

The die bonding film contributes to simplifying and improving the throughput of the die bonding step. A commercially available product can be used as the die bonding film. In the laminate, the die bonding film is usually larger than the semiconductor wafer, and typically has a circular or substantially circular shape.

There are no particular limitations on the thickness and size of the die bonding film. From the viewpoint of preventing detachment from the semiconductor wafer, the diameter of the die bonding film is, for example, preferably not more than 350 mm, more preferably not more than 335 mm, and still more preferably 320 mm or less. Although not being specific restrictions, these sizes are particularly suited to semiconductor wafers having a diameter of 300 mm.

The dicing tape is a tape which protects and secures the semiconductor wafer in the semiconductor wafer dicing step, and is then used for holding the semiconductor chip in subsequent steps. A commercially available product can be used as the dicing tape. In the laminate, the dicing tape is usually larger than the die bonding film, and typically has a circular or substantially circular shape.

There are no particular limitations on the thickness and size of the dicing tape. From the viewpoints of operability and processability, the thickness of the dicing tape is, for example, preferably 70 μm or greater.

The die bonding film and the dicing tape are also available commercially in the form of a dicing-die bonding integrated sheet in which the two items are stuck together. By using a dicing-die bonding integrated sheet, the affixing of the die bonding film and the dicing tape to the rear surface of the semiconductor wafer can be performed in a single operation. Using a dicing-die bonding integrated sheet contributes to a shortening of the manufacturing steps for a semiconductor device, and an improvement in the handling properties of the thin wafer.

The laminate having the semiconductor wafer, the die bonding film and the dicing tape usually has at least the semiconductor wafer, the die bonding film and the dicing tape provided in that order. Besides these layers, the laminate may also have other optional layers such as a protective tape for protecting the semiconductor wafer surface, or a support film for supporting the dicing tape. Further, the die bonding film and the dicing tape may each be formed from a single layer or a plurality of layers.

In terms of facilitating recognition of those sections in which the die bonding film has not been cut following expansion, the die bonding film and the dicing tape preferably differ in terms of transparency or color tone or the like.

Figure 3:
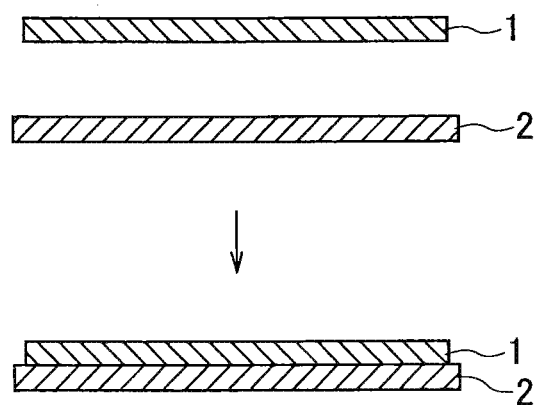
FIG. 3 is a schematic diagram illustrating one embodiment of a step of affixing a die bonding film to a semiconductor wafer.
Figure 4:
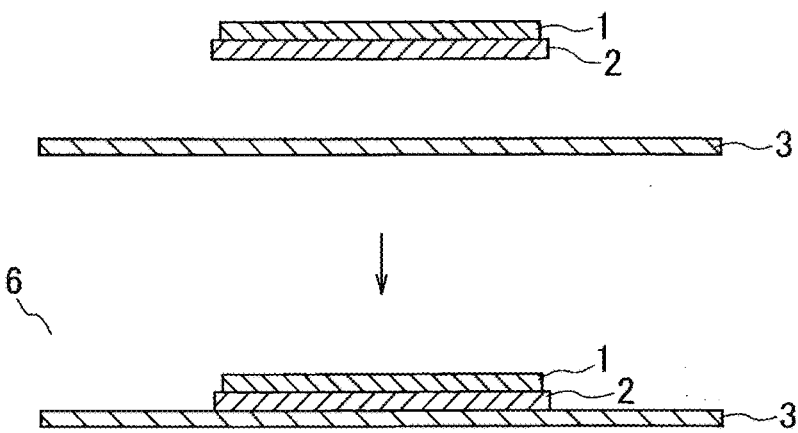
FIG. 4 is a schematic diagram illustrating one embodiment of a step of affixing a dicing tape to a die bonding film.

The laminate can be obtained, for example, by affixing the die bonding film to the rear surface of the semiconductor wafer, and then affixing the dicing tape to the die bonding film. FIG. 3 is a schematic diagram illustrating one embodiment of a step of affixing the die bonding film 2 to the semiconductor wafer 1, whereas FIG. 4 is a schematic diagram illustrating one embodiment of a step of affixing the dicing tape 3 to the die bonding film 2.

There are no particular limitations on the temperature and the pressure when affixing the die bonding film to the semiconductor wafer, and these values may be determined as appropriate, with due consideration of the adhesiveness and the like of the die bonding film.

There are no particular limitations on the temperature and the pressure when affixing the dicing tape to the die bonding film, and these values may be determined as appropriate, with due consideration of the adhesiveness and the pressure-sensitive adhesiveness and the like of the die bonding film and the dicing tape.

Figure 5:
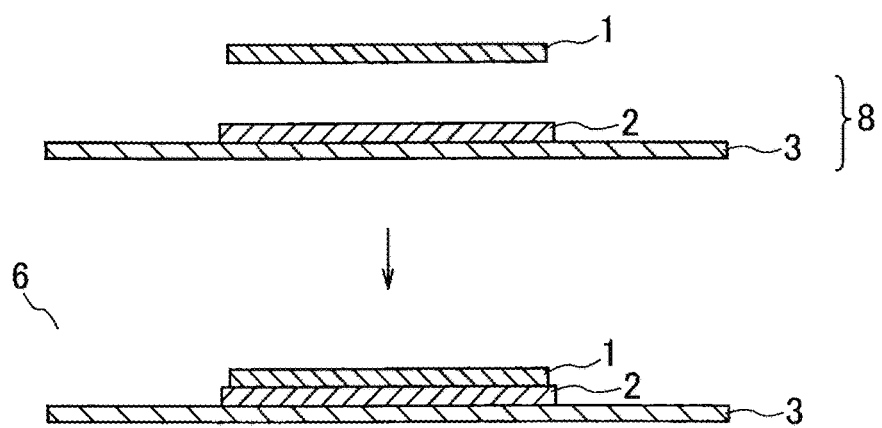
FIG. 5 is a schematic diagram illustrating one embodiment of a step of affixing a dicing-die bonding integrated sheet to a semiconductor wafer.

Furthermore, when a dicing-die bonding integrated sheet is used, the laminate can be obtained by affixing the die bonding film-side surface of the dicing-die bonding integrated sheet to the rear surface of the semiconductor wafer. FIG. 5 is a schematic diagram illustrating one embodiment of a step of affixing a dicing-die bonding integrated sheet 8 to the semiconductor wafer 1.

There are no particular limitations on the temperature and the pressure when affixing the dicing-die bonding integrated sheet to the semiconductor wafer. From the viewpoint of improving the adhesion with the semiconductor wafer, the temperature during the affixing process is, for example, preferably at least 50° C., and from the viewpoint of the heat resistance of the dicing tape, is preferably not more than 80° C.

The formation of the modified sections inside the interior of the semiconductor wafer can be performed before affixing the die bonding film to the semiconductor wafer, after affixing the die bonding film to the semiconductor wafer, or after affixing the die bonding film and the dicing tape, or the dicing-die bonding integrated sheet, to the semiconductor wafer.

When the formation of the modified sections is performed before the affixing steps, the affixing steps are preferably performed with the semiconductor wafer supported, in order to prevent the semiconductor wafer from breaking as a result of the stress applied to the semiconductor wafer during the affixing process.

When the formation of the modified sections is performed after the affixing steps, if a die bonding film and a dicing tape, or a dicing-die bonding integrated sheet, which transmit the laser beam are used, then irradiation of the laser beam can also be performed from the rear surface of the semiconductor wafer.

(Step (IIA))

Next, the dicing tape 3 is expanded with the laminate 6 in a cooled state (step (IIA)). The expression "with the laminate in a cooled state" means a state in which the temperature of the laminate is lower than room temperature. It does not matter whether or not the expansion is being performed while the laminate is being cooled. The dicing tape may be expanded after the laminate has already been cooled, or may be expanded while the laminate is being cooled.

The temperature of the laminate during the expansion is a temperature lower than room temperature (for example, 25° C.). From the viewpoint of improving the divisibility of the die bonding film, the temperature of the laminate is, for example, preferably not higher than 10° C., more preferably 0° C. or lower, still more preferably −5° C. or lower, and particularly preferably −10° C. or lower. In terms of the divisibility of the die bonding film, the temperature of the laminate is preferably as low as possible. However, from the view point of maintaining a practical level for the mechanical properties of the die bonding film and the dicing tape, the temperature of the laminate is preferably not lower than −15° C. The temperature of the laminate refers to the value obtained by measuring the temperature of the upper surface of the semiconductor wafer or the temperature of the rear surface of the dicing tape (the surface not affixed to the die bonding film).

There are no particular limitations on the cooling method. Examples include methods using a cooling air stream from a chiller, and methods using a cooling stage or the like equipped with a cooling device.

The expansion of the dicing tape is performed by applying an external force to the dicing tape, and there are no particular limitations on the method used for performing this expansion. The external force is applied so that the dicing tape expands in the in-plane direction. In this step, the dicing tape is usually expanded radially.

The expansion performed in the step (IIA) is usually not performed for the purpose of dividing the semiconductor wafer and the die bonding film into chips. However, some partial separation into chips along the intended cutting lines may occur. Alternatively, in some cases the semiconductor wafer may partially separate without any separation occurring in the die bonding film.

There are no particular limitations on the expansion time. For example, the time is preferably at least 5 seconds, and is preferably not more than 60 seconds. The expansion time corresponds with the time for which the external force is applied.

From the viewpoint of improving the divisibility of the die bonding film, the expansion rate is, for example, preferably at least 10 mm/second, and more preferably 50 mm/second or greater. Further, from the viewpoint of suppressing the problem in which outer peripheral sections of the die bonding film are scattered across the wafer, the expansion rate is, for example, preferably not more than 400 mm/second, and more preferably 200 mm/second or less.

(Step (IIB))

After the step (IIA), the expanded dicing tape 3 is loosened (step (IIB)). This "loosening of the dicing tape" refers to reducing, or eliminating, the external force applied to the dicing tape in the step (IIA).

When the dicing tape is loosened, the laminate may be either in a cooled state or an uncooled state. In other words, the temperature of the dicing tape may be a temperature that is lower than room temperature, or may be a temperature equal to or greater than room temperature. The dicing tape is usually in a cooled state.

When no other optional steps are included between the step (IIA) and the step (IIC), the time period from the point where loosening of the expanded dicing tape is started in the step (IIB) through to the point where expansion of the dicing tape is started again in the step (IIC) is termed the dicing tape loosening time. From the viewpoint of operability, or from the viewpoint of maintaining the cooled state depending on the cooling method that is used, this loosening time is, for example, preferably not longer than 10 seconds, and more preferably 5 seconds or less. Further, from the viewpoint of improving the divisibility of the die bonding film, the loosening time is preferably at least 1 second.

By loosening the dicing tape, the expanded dicing tape usually contracts. However, in some cases the expanded state may be maintained so that no contraction occurs. In the step (IIB), the dicing tape may either contract, or be held in the expanded state.

(Step (IIC))

Subsequently, the dicing tape 3 is expanded with the laminate 6 in a cooled state, thereby dividing the semiconductor wafer 1 and the die bonding film 2 into chips 7 along the intended cutting lines 4, and widening the spaces between the chips 7 (step (IIC)). The expression "with the laminate in a cooled state" describes the same state as that in the aforementioned step (IIA). Further, in the same manner as the step (IIA), the expansion of the dicing tape is performed by applying an external force to the dicing tape, but there are no particular limitations on the method used for performing this expansion. The external force is applied so that the dicing tape expands in the in-plane direction. In this step, the dicing tape is usually expanded radially.

In the step (IIC), by expanding the dicing tape, the semiconductor wafer and the die bonding film are divided into chips along the intended cutting lines, and the spaces between the chips are widened. Although there are no particular limitations on the space between chips (also referred to as the "kerf width"), from the viewpoint of the pickup properties in the subsequent pickup step, the space is preferably at least 10 µm, more preferably 30 µm or greater, and still more preferably 50 µm or greater.

There are no particular limitations on the expansion time. For example, the time is preferably at least 5 seconds, and is preferably not more than 60 seconds. The expansion time corresponds with the time for which the external force is applied.

From the viewpoint of improving the divisibility of the die bonding film, the expansion rate is, for example, preferably at least 10 mm/second, and more preferably 50 mm/second or greater. Further, from the viewpoint of suppressing the problem in which outer peripheral sections of the die bonding film are scattered across the wafer, the expansion rate is, for example, preferably not more than 400 mm/second, and more preferably 200 mm/second or less.

From the viewpoint of improving the divisibility, the external force applied to the dicing tape in the step (IIC) is preferably larger than the force applied to the dicing tape in the step (IIA).

The steps of expanding and then loosening the dicing tape may be repeated. In other words, following the step (I), the preparation may be conducted in accordance with a sequence represented by step (IIA)→step (IIB)→step (IIA)→step (IIB)→step (IIC).

A commercially available expansion apparatus can be used for performing step (IIA) to step (IIC). Examples of the expansion apparatus include an apparatus "MAE300" (manufactured by Tokyo Seimitsu Co., Ltd.) and a "Die Separator DDS2300" (manufactured by DISCO Corporation).

By performing the steps of expanding, loosening, and then once again expanding the dicing tape, the extensibility of the dicing tape is improved, and even if the laminate is in a cooled state, the dicing tape can be expanded satisfactorily, enabling division of the semiconductor wafer and the die bonding film to be performed favorably.

In the stealth dicing method, it is thought that the cutting of the semiconductor wafer and the die bonding film proceeds in the following manner. First, when the dicing tape is expanded, an external force is applied to the semiconductor wafer, and cracks occur through the thickness direction of the semiconductor wafer, with the modified sections inside the semiconductor wafer acting as starting points. Subsequently, these cracks reach through to the upper surface and the lower surface of the semiconductor wafer, and then to the die bonding film which is adhered to the semiconductor wafer, causing the semiconductor wafer and the die bonding film to fracture.

If the dicing tape exhibits superior extensibility, then it is thought that the size of the external force applied to the semiconductor wafer increases, enabling the semiconductor wafer and the die bonding film to be divided with superior yield.

In the aforementioned conventional expansion method illustrated in FIG. 18, when the force pushing upward on the dicing tape 3 is increased in order to increase the extensibility of the dicing tape 3, various problems such as the so-called necking phenomenon or rupture may occur, and achieving satisfactory expansion of the dicing tape 3 is difficult.

Occurrence of the necking phenomenon is particularly marked when a dicing tape having low intermolecular interactions is used, such as a dicing tape formed from a general-purpose polyolefin-based material such as polyethylene (PE) or polypropylene (PP). According to the present embodiment, even if a dicing tape having low intermolecular interactions is used, the occurrence of the necking phenomenon and rupture can be reduced, and the extensibility of the dicing tape can be improved.

For example, according to the present embodiment, the amount of expansion of the dicing tape is preferably at least 1.0 mm, more preferably at least 1.5 mm, still more preferably at least 2.0 mm, and particularly preferably 3.0 mm or greater. However, from the viewpoint of suppressing rupture of the dicing tape, the amount of expansion is preferably not more than 6.0 mm. The amount of expansion [mm] is the value along a line passing through the center of the dicing tape calculated using the formula "(length after expansion [mm])–(length before expansion [mm])". Although not a particular limitation, the above numerical range is particularly suited to the cutting of semiconductor wafers having a diameter that is preferably 200 mm or greater, and more preferably 300 mm or greater.

Figure 14A:
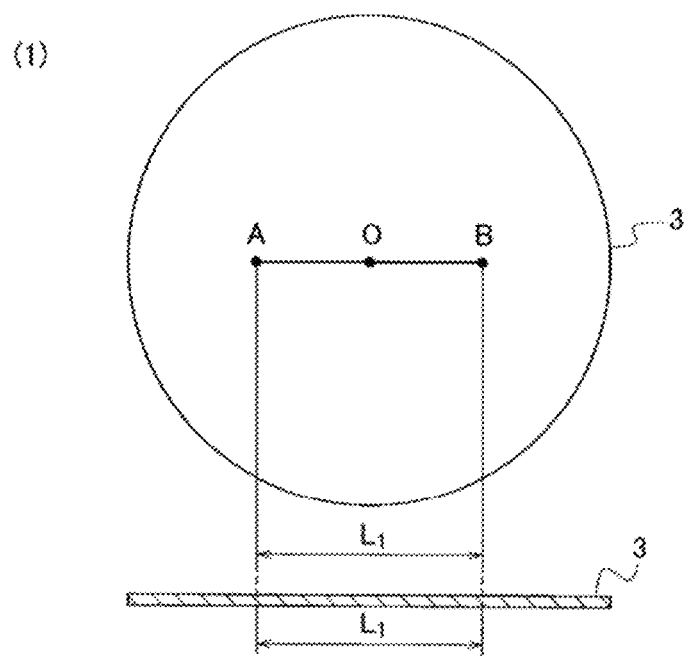
FIG. 14A is a schematic diagram illustrating one embodiment of a dicing tape used for evaluating the amount of expansion and the expansion ratio.
Figure 14A:
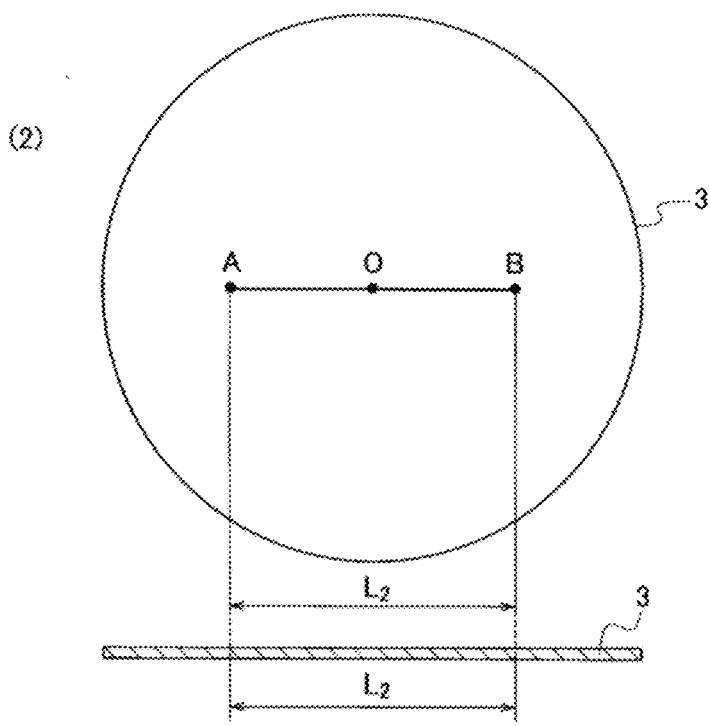

The amount of expansion can be measured using the method described below. FIG. 14A illustrates schematic views (plan views and cross-sectional views) of a dicing tape before expansion and a dicing tape after expansion.

(1) A mark A is made on the dicing tape 3 at a position that is a distance $L_1/2$ [mm] from the center O of the dicing tape 3 before expansion. (FIG. 14A(1)).

(2) A mark B is made in a position having point symmetry relative to the mark A about the center O. The distance $L_1$ [mm] between A and B is deemed the "length before expansion [mm]" (FIG. 14A(1)).

(3) The dicing tape 3 is expanded using the expansion method of the present embodiment.

(4) A distance $L_2$ [mm] between A and B in the dicing tape 3 after the expansion is measured and deemed the "length after expansion [mm]" (FIG. 14A(2)).

(5) The amount of expansion [mm] is determined from "(length after expansion [mm])–(length before expansion [mm])".

It is preferable that the amount of expansion determined in an arbitrary direction of the dicing tape satisfies the above range, and it is particularly preferable that the average value of the amounts of expansion determined in the MD direction and the TD direction of the dicing tape satisfies the above range.

Further, according to the present embodiment, the expansion ratio for the dicing tape following the step (IIC) can, for example, preferably be set to at least 1.0%, more preferably at least 1.5%, still more preferably at least 2.0%, and particularly preferably 3.0% or greater. However, from the viewpoint of suppressing rupture of the dicing tape, the expansion ratio is preferably not more than 3.0%, and more preferably 2.0% or less. The expansion ratio [%] is a value determined along a line passing through the center of the dicing tape using the formula "(amount of expansion [mm])/(length before expansion [mm])×100". Although not a particular limitation, this numerical range is particularly suited to semiconductor wafers having a diameter that is preferably 200 mm or greater, and more preferably 300 mm or greater. The "amount of expansion [mm]" and the "length before expansion [mm]" are as defined above.

It is preferable that the expansion ratio determined in an arbitrary direction of the dicing tape satisfies the above range, and it is particularly preferable that the average value of the expansion ratios determined in the MD direction and the TD direction of the dicing tape satisfies the above range.

When measuring the amount of expansion and the expansion ratio, the length before expansion may be set appropriately in accordance with the size of the semiconductor wafer being cut, namely the size of the semiconductor wafer to which the dicing tape is affixed. For example, in the case of a dicing tape used for dividing a semiconductor wafer having a diameter D [mm], it is preferable that the amount of expansion and the expansion ratio measured using a value of (D–5) to (D+5) as the distance $L_1$ [mm] between the marks A and B satisfy the respective ranges described above. In a specific example, in the case of a dicing tape used on a semiconductor wafer having a diameter of 300 mm, the amount of expansion and the expansion ratio when $L_1$=250 mm preferably satisfy the respective ranges described above.

Evaluation of the amount of expansion and the expansion ratio of the dicing tape may also be performed using a dicing-die bonding integrated sheet instead of the dicing tape. If a dicing-die bonding integrated sheet is expanded in a stand-alone state not laminated to a semiconductor wafer, then because no cracking start points exist, the die bonding film usually does not fracture, but is rather expanded together with the dicing tape. Even in those cases where the die bonding film is also expanded, the amount of expansion and the expansion ratio of the dicing-die bonding integrated sheet can be used as the amount of expansion and the expansion ratio for the dicing tape.

Comparing the present embodiment with a conventional expansion method, if the external force applied in the step (IIC) and the external force applied in the conventional expansion method are set to the same level, then the amount of expansion and the expansion ratio for the dicing tape can be increased in the present embodiment by at least 1.5-fold, and preferably at least 2-fold.

The present embodiment provides a superior expansion method which enables the extensibility of a commercially available dicing tape to be improved via simple steps, without using any special equipment, and without requiring any complex steps. By using the expansion method of the present embodiment, a semiconductor wafer and a die bonding film can be cut favorably.

Second Embodiment

The second embodiment relates to an expansion method comprising: a step (Ia) of preparing a laminate having a semiconductor wafer in which modified sections have been formed along intended cutting lines, a die bonding film, a dicing tape and a frame; a step (Ib) of supplying the laminate to the top of a height-adjustable expansion stage of an expansion apparatus comprising the expansion stage and a fastening member capable of fastening the frame; a step (Ic) of fastening the frame using the fastening member; a step (IIa) of raising the expansion stage and expanding the dicing tape with the laminate in a cooled state; a step (IIb) of lowering the raised expansion stage and loosening the expanded dicing tape; and a step (IIc) of raising the expansion stage and expanding the dicing tape with the laminate in a cooled state, dividing the semiconductor wafer and the die bonding film into chips along the intended cutting lines, and widening the spaces between the chips.

Figure 6A:
FIG. 6A is a schematic diagram illustrating one embodiment (steps (Ia) to (IIa)) of the expansion method.
Figure 6A:
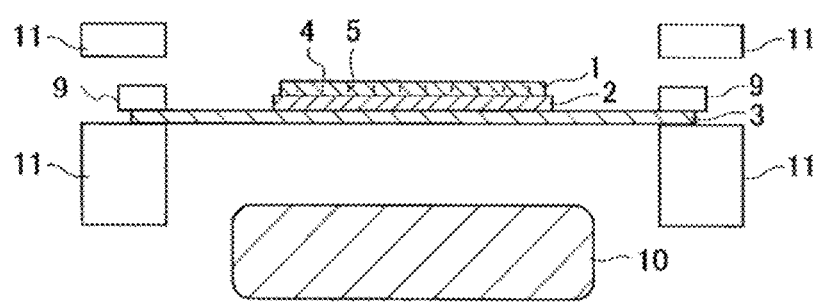
Figure 6A:
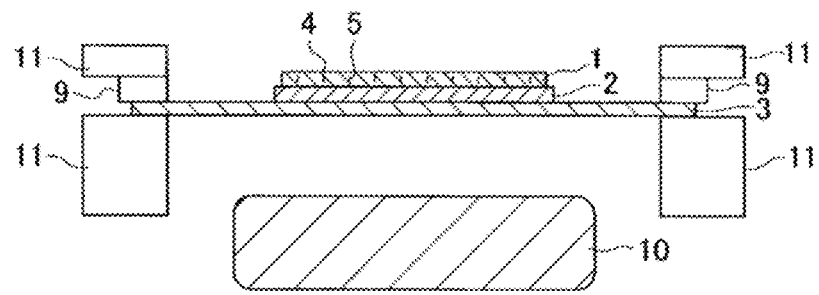
Figure 6A:
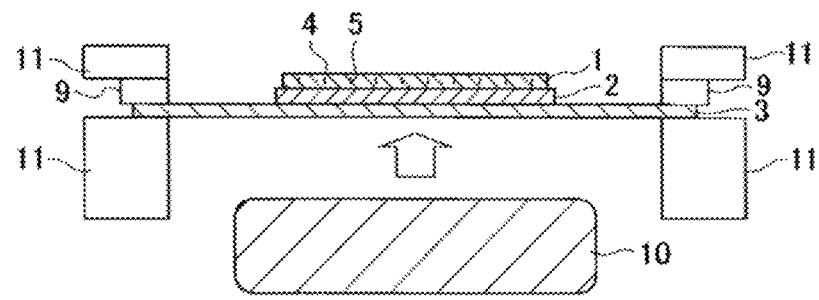
Figure 6A:
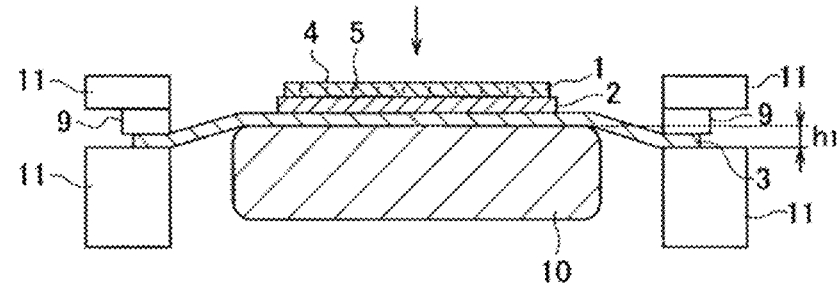
Figure 6B:
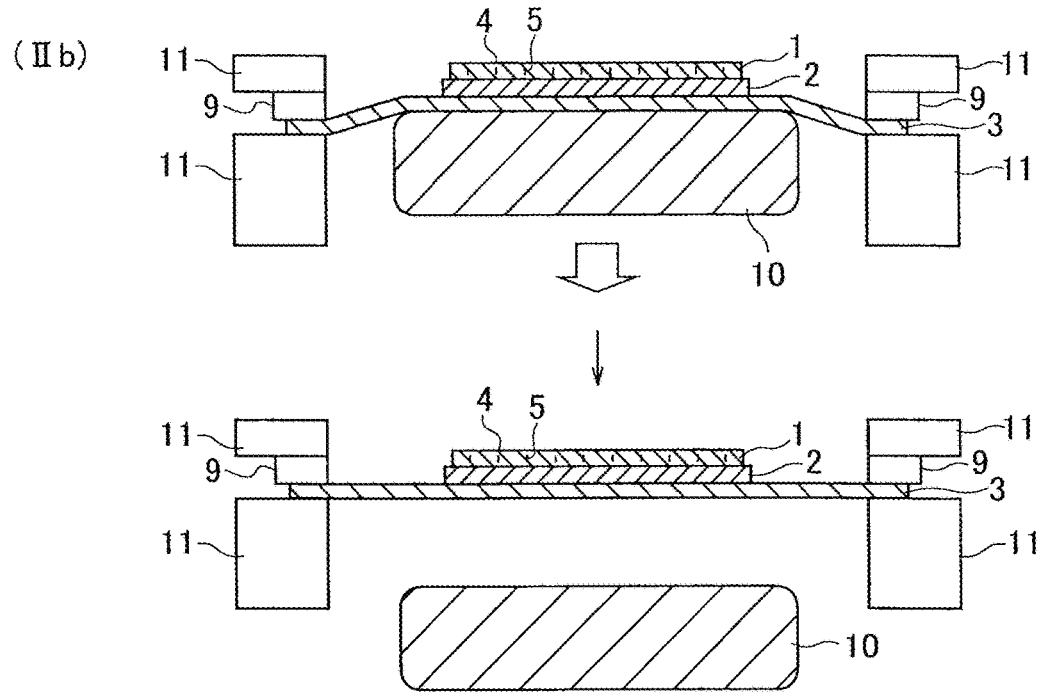
FIG. 6B is a schematic diagram illustrating one embodiment (steps (IIb) to (IIc)) of the expansion method.
Figure 6B:
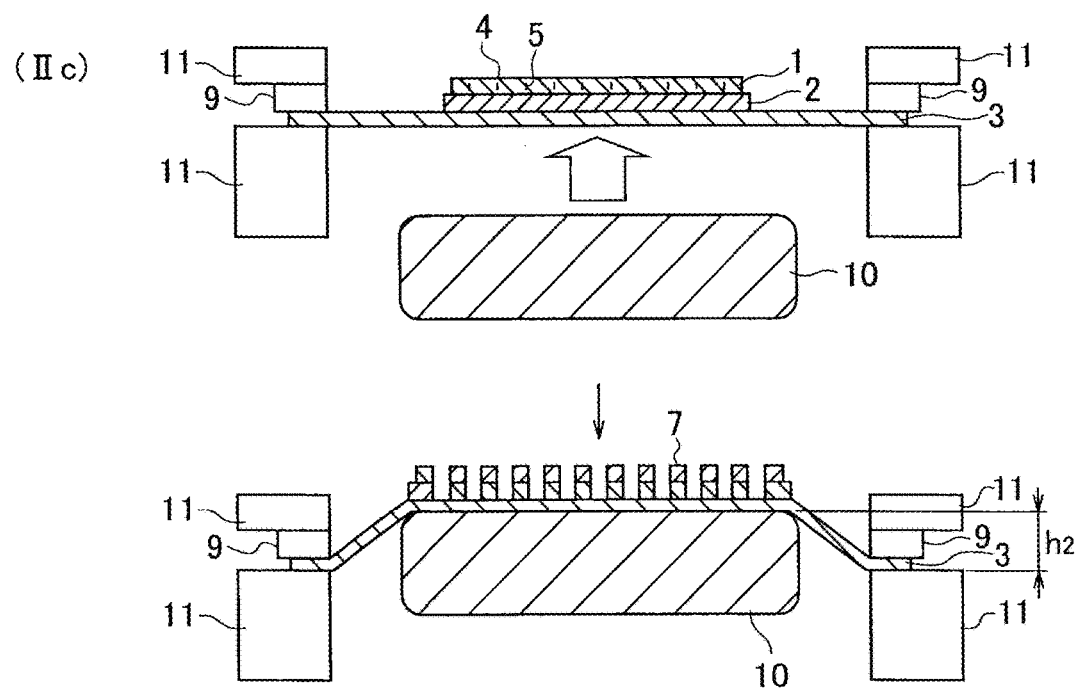
Figure 9:
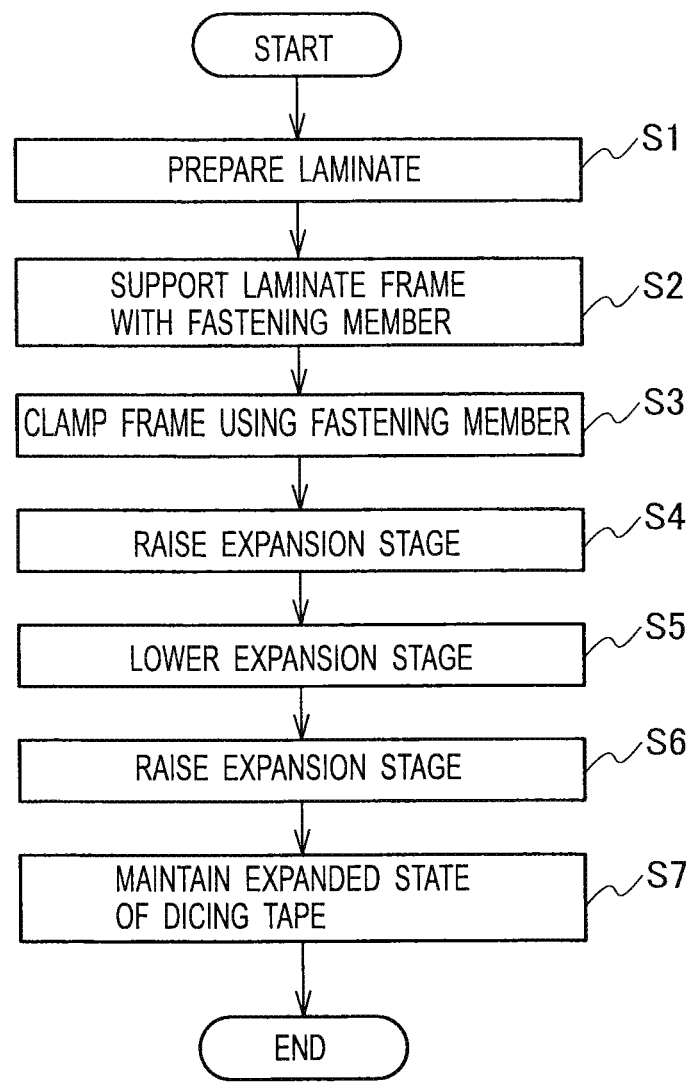
FIG. 9 is a flow chart illustrating one embodiment of the expansion method.

FIG. 6A and FIG. 6B are schematic diagrams illustrating this embodiment of the expansion method, and FIG. 9 is a flowchart illustrating this embodiment of the expansion method. In the present embodiment, an expansion apparatus is used which comprises a height-adjustable expansion stage and a fastening member capable of fastening the frame.

Where applicable, the description relating to the first embodiment can also be applied to the present embodiment.
(Step (Ia))

First, a laminate 6' having a semiconductor wafer 1 in which modified sections 5 have been formed along intended cutting lines 4, a die bonding film 2, a dicing tape 3 and a frame 9 is prepared (step (Ia), step S1). The laminate 6' in the present embodiment has the frame 9 in addition to the semiconductor wafer 1 in which the modified sections 5 have been formed along the intended cutting lines 4, the die bonding film 2 and the dicing tape 3.

Figure 8:
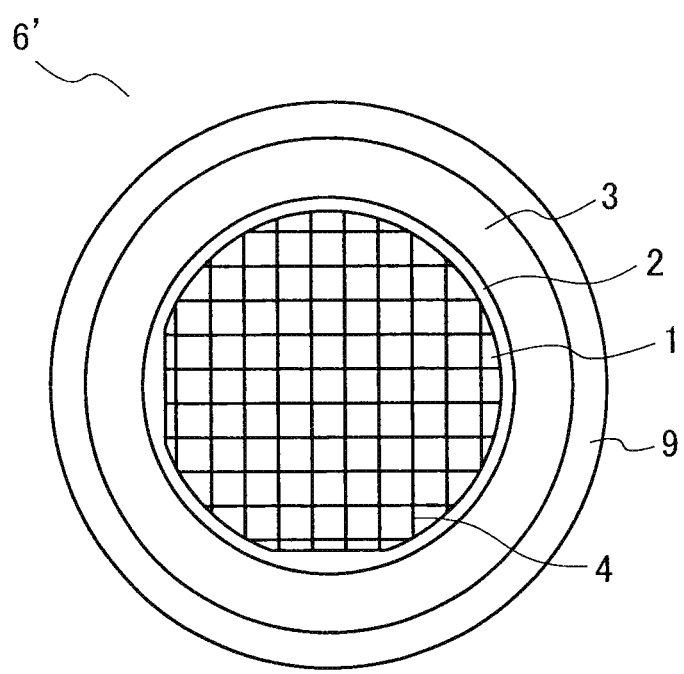
FIG. 8 is a schematic diagram illustrating one embodiment of a laminate.

FIG. 8 is a schematic plan view illustrating an embodiment of the laminate 6'. The frame 9 is affixed to the surface of the dicing tape 3 to which the semiconductor wafer 1 and the die bonding film 2 are laminated. The frame may also be affixed to the surface of the dicing tape 3 opposite the surface to which the semiconductor wafer 1 and the die bonding film 2 are laminated. A rigid ring-shaped frame is usually used as the frame 9. There are no particular limitations on the frame 9, and examples include frames formed from metal materials such as stainless steel or aluminum, and frames formed from resin materials such as polycarbonate. A conventionally known frame typically used in a dicing step may be selected appropriately as the frame 9, in accordance with the size of the semiconductor wafer 1.
(Step (Ib))

Next, the laminate 6' is supplied to the top of a height-adjustable expansion stage 10 of an expansion apparatus comprising the expansion stage 10 and a fastening member 11 capable of fastening the frame (step (Ib), step S2). The expansion stage 10 is a circular cylindrical stage having a larger diameter than the semiconductor wafer 1 and a smaller diameter than the frame 9, and can be raised and lowered. The expansion stage 10 may also include an internal or external cooling device (not shown in the figures). The fastening member 11 is a member capable of fastening the frame 9 in a prescribed position, and there are no particular limitations on the shape of the member. For example, a member having a shape capable of clamping the frame 9 from above and below may be used. The expansion stage 10 is disposed so that upper surface of the stage is positioned at the same height as, or lower than, the rear surface (the dicing tape-side surface) of the laminate 6' that is supplied to the expansion apparatus.

As illustrated in FIG. 6A, when the laminate 6' is supplied, the frame 9 is supported by the fastening member 11. Depending on the position in which the expansion stage 10 is disposed, the embodiment upon supply of the laminate 6' to the top of the expansion stage 10 includes both the embodiment in which the expansion stage 10 and the laminate 6' are in contact and the embodiment in which the expansion stage 10 and the laminate 6' are not in contact. The latter case is illustrated in FIG. 6A. In both of these embodiments, the laminate 6' is supplied so that the semiconductor wafer 1 is positioned within the diameter of the expansion stage 10.
(Step (Ic))

Following supply of the laminate 6' to the top of the expansion stage 10, the frame 9 is fastened with the fastening member 11 (step (Ic), step S3). In FIG. 6A, the frame 9 is clamped by the fastening member 11.
(Step (IIa))

Subsequently, by raising the expansion stage 10 and pushing the dicing tape 3 upward with the laminate 6' in a cooled state, the dicing tape 3 is expanded radially (step (IIa), step S4). There are no particular limitations on the cooling method, but in the case where the expansion stage 10 is equipped with a cooling device (not shown in the figures), the laminate 6' is brought into close proximity with, or into contact with, the expansion stage 10, thereby lowering the temperature of the laminate 6' to a temperature lower than room temperature, and placing the laminate 6' in a cooled state.

When the expansion stage 10 is equipped with a cooling device, from the viewpoint of improving the divisibility of the die bonding film, the temperature of the upper surface of the expansion stage 10 is preferably not higher than 10° C., more preferably 0° C. or lower, still more preferably −5° C. or lower, and particularly preferably −10° C. or lower.

Commercially available expansion apparatus are generally provided with a device which can preset the raising distance for the expansion stage 10. From the viewpoint of improving the divisibility of the die bonding film, the set value in this device (also referred to as the "raising distance setting") is preferably at least 5 mm, more preferably 7 mm or greater, and still more preferably 10 mm or greater. Further, from the viewpoint of inhibiting rupture of the dicing tape, the raising distance setting is, for example, preferably not more than 15 mm. In a commercially available expansion apparatus, if the expansion stage 10 is raised in a state without the laminate 6' supplied to the top of the expansion stage 10, then the raising distance prescribed by the "raising distance setting" is usually obtained. The raising distance setting is a set value represented by "(total distance raised for expansion stage 10)−(distance raised to bring expansion stage 10 into contact with rear surface of laminate 6')" ($h_1$ in FIG. 6A, $h_2$ in FIG. 6B).

Further, commercially available expansion apparatus are generally provided with a device which can preset the speed with which the expansion stage 10 is raised. From the viewpoint of improving the divisibility of the die bonding film, the set value in this device (also referred to as the "raising speed setting") is preferably at least 10 mm/second, and more preferably 50 mm/second or greater. Further, from the viewpoint of suppressing the problem in which outer peripheral sections of the die bonding film are scattered across the wafer, the raising speed setting is, for example, preferably not more than 400 mm/second, and more preferably 200 mm/second or less. In a commercially available expansion apparatus, if the expansion stage 10 is raised in a state without the laminate 6' supplied to the top of the expansion stage 10, then the raising speed prescribed by the "raising speed setting" is usually obtained.
(Step (IIb))

Following the step (IIa), the raised expansion stage 10 is lowered, and the expanded dicing tape 3 is loosened (step (IIb), step S5). The expansion stage 10 may be lowered to its original position, namely the same position as that before the raising process, or may be lowered to an arbitrary position partway between the raised position and the original position. As illustrated in FIG. 6B, the expansion stage 10 is preferably lowered to its original position.
(Step (IIc))

Subsequently, by raising the expansion stage 10 and pushing the dicing tape 3 upward with the laminate 6' in a cooled state, the dicing tape 3 is expanded radially. As a result, the semiconductor wafer 1 and the die bonding film 2 are divided into chips 7 along the intended cutting lines 4, and the spaces between the chips are widened (step (IIc), step S6). The cooling method is the same as that described above for the step (IIa).

From the viewpoint of improving the divisibility of the die bonding film, the raising distance setting for the expansion stage 10 is, for example, preferably at least 5 mm, more preferably 7 mm or greater, and still more preferably 10 mm or greater. Further, from the viewpoint of inhibiting rupture of the dicing tape, the raising distance setting is, for example, preferably not more than 18 mm, and more preferably 15 mm or less.

Furthermore, from the viewpoint of improving the divisibility of the die bonding film, the raising speed setting for the expansion stage 10 is preferably at least 10 mm/second, and more preferably 50 mm/second or greater. Further, from the viewpoint of suppressing the problem in which outer peripheral sections of the die bonding film are scattered across the wafer, the raising speed setting is, for example, preferably not more than 400 mm/second, and more preferably 200 mm/second or less.

Although not a particular limitation, the raising distance setting and the raising speed setting in the step (IIa) and the step (IIc) are particularly suited to semiconductor wafers having a diameter that is preferably 200 mm or greater, and more preferably 300 mm or greater. The raising distance setting and the raising speed setting may be determined appropriately with due consideration of factors such as the diameter of the semiconductor wafer, the diameter of the expansion stage, the chip size, and the kerf width.

In the present embodiment, from the viewpoint of improving the divisibility of the die bonding film, the raising distance setting for the expansion stage 10 in the step (IIe) is preferably the same as, or greater than, the raising distance setting for the expansion stage 10 in the step (IIa). The raising distance setting for the expansion stage 10 in the step (a) is preferably set to a value that is at least 1.0 times, more preferably at least 1.5 times, and still more preferably at least 2.0 times, the raising distance setting for the expansion stage 10 in the step (IIa).

(Step (IId))

Following the step (IIc), a step may be provided for maintaining the expanded state of the dicing tape 3 (step (IId), step S7). Examples of the method used for maintaining the expanded state include a method in which the dicing tape 3 is affixed to a separate frame from the frame 9, and a method in which the portions of the dicing tape 3 positioned outside the semiconductor wafer 1 are subjected to heat shrinkage. There are no particular limitations on the heating temperature for the dicing tape when performing the heat shrinkage, and for example a temperature of 80° C. may be used.

Third Embodiment

The third embodiment relates to an expansion method comprising: a step (Ia') of preparing a laminate having a semiconductor wafer in which modified sections have been formed along intended cutting lines, a die bonding film, a dicing tape and a frame; a step (Ib') of supplying the laminate to the top of a height-adjustable expansion ring of an expansion apparatus comprising the expansion ring and a fastening member capable of fastening the frame; a step (Ic') of fastening the frame using the fastening member; a step (IIa') of raising the expansion ring and expanding the dicing tape with the laminate in a cooled state; a step (IIb') of lowering the raised expansion ring and loosening the expanded dicing tape; and a step (IIc') of raising the expansion ring and expanding the dicing tape with the laminate in a cooled state, dividing the semiconductor wafer and the die bonding film into chips along the intended cutting lines, and widening the spaces between the chips.

Figure 7A:
FIG. 7A is a schematic diagram illustrating one embodiment (steps (Ia') to (IIa')) of the expansion method.
Figure 7A:
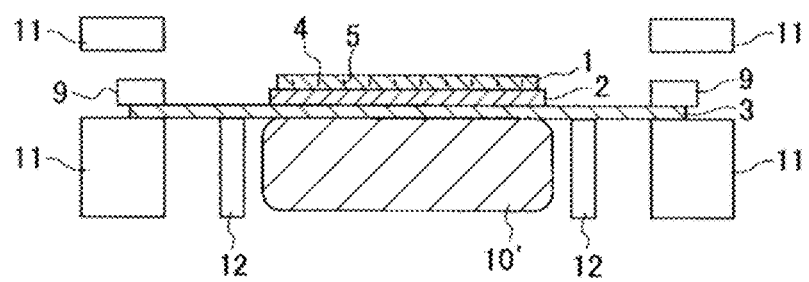
Figure 7A:
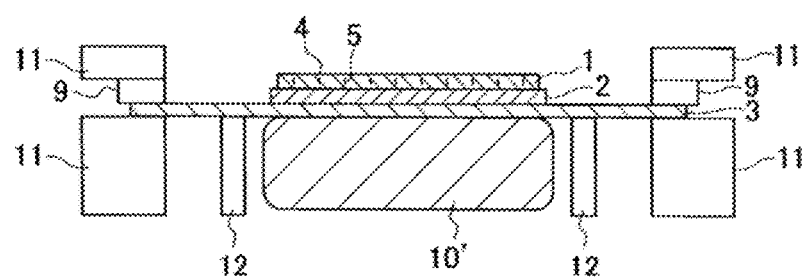
Figure 7A:
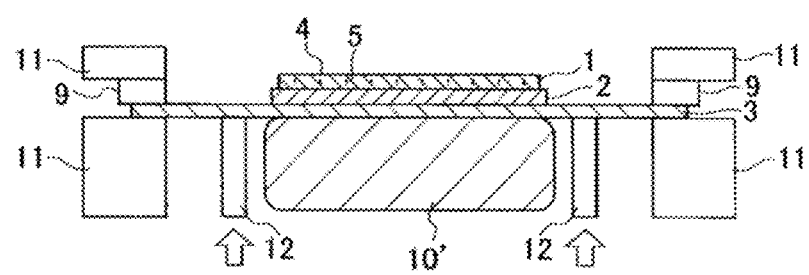
Figure 7A:
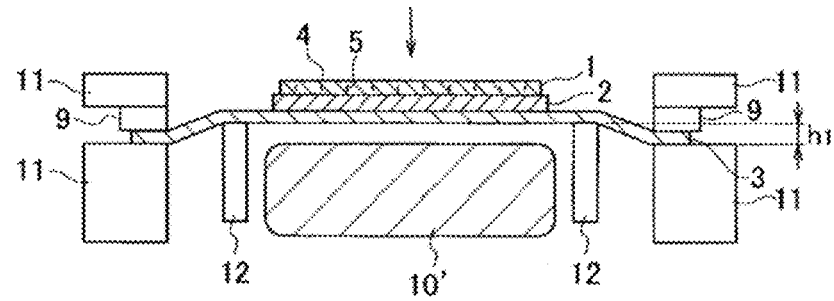
Figure 7B:
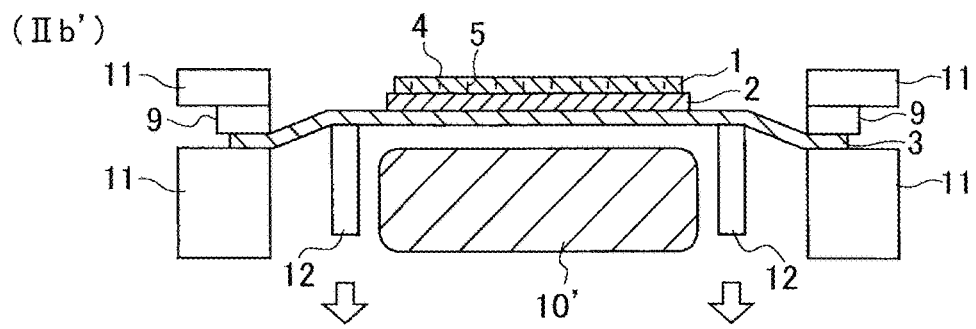
FIG. 7B is a schematic diagram illustrating one embodiment (steps (IIb') to (IIb')) of the expansion method.
Figure 7B:
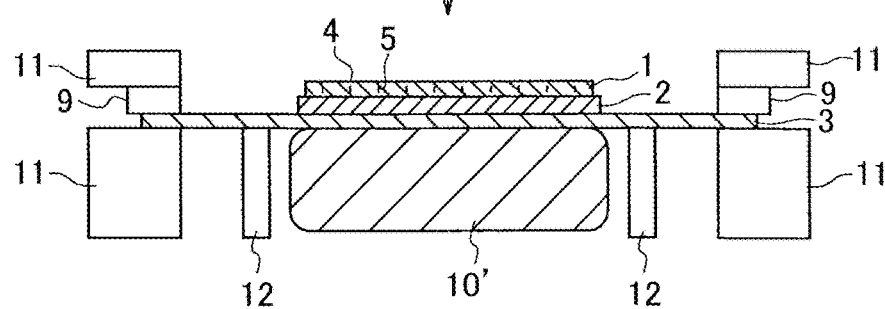
Figure 7B:
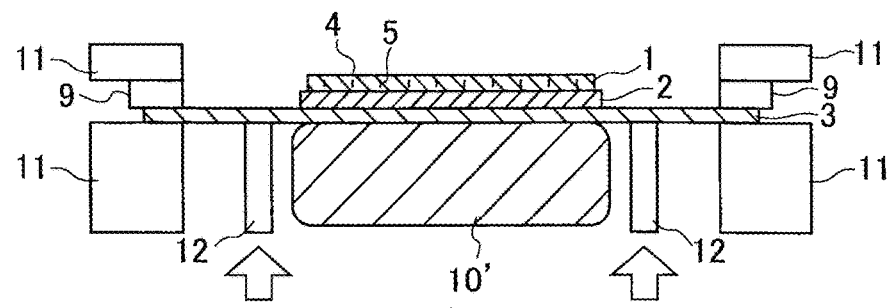
Figure 7B:
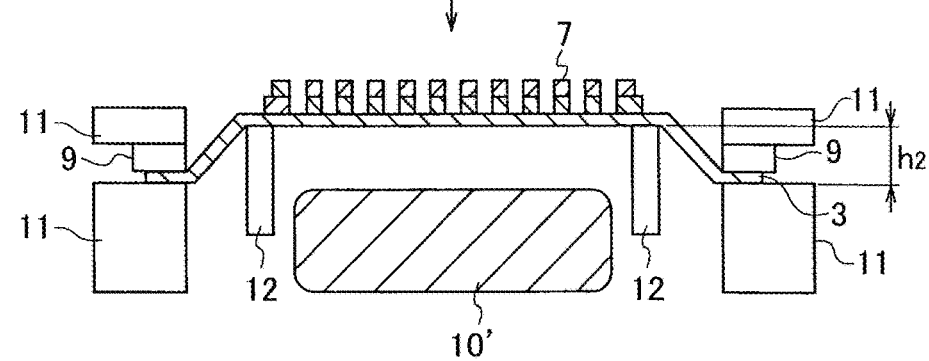

FIG. 7A and FIG. 7B are schematic diagrams illustrating this embodiment of the expansion method. In the present embodiment, an expansion apparatus is used which comprises a height-adjustable expansion ring and a fastening member capable of fastening the frame. This embodiment differs from the second embodiment in the use of the height-adjustable expansion ring instead of the aforementioned height-adjustable expansion stage. The step (Ia') is the same as the step (Ia). Where applicable, the descriptions relating to the first and second embodiments can also be applied to the present embodiment, and the description relating to the expansion stage in the second embodiment can also be applied to the expansion ring.

(Step (Ib'))

In the present embodiment, the laminate 6' is supplied to the top of a height-adjustable expansion ring 12 of an expansion apparatus comprising the expansion ring 12 and a fastening member 11 capable of fastening the frame (step (Ib')). The expansion ring 12 is a ring having a larger inner diameter than the semiconductor wafer 1 and a smaller outer diameter than the frame 9, and can be raised and lowered. The expansion ring 12 is disposed so that upper surface of the ring is positioned at the same height as, or lower than, the rear surface (the dicing tape-side surface) of the laminate 6' that is supplied to the expansion apparatus.

As illustrated in FIG. 7A, when the laminate 6' is supplied, the frame 9 is supported by the fastening member 11. Depending on the position in which the expansion ring 12 is disposed, the embodiment upon supply of the laminate 6' to the top of the expansion stage 10 includes both the embodiment in which the expansion ring 12 and the laminate 6' are in contact and the embodiment in which the expansion ring 12 and the laminate 6' are not in contact. The former case is illustrated in FIG. 7A. In both of these embodiments, the laminate 6' is supplied so that the semiconductor wafer 1 is positioned inside the outer diameter of the expansion ring 12.

(Step (Ic'))

Following supply of the laminate to the top of the expansion ring 12, the frame 9 is fastened with the fastening member 11 (step (Ic')). In FIG. 7A, the frame 9 is clamped by the fastening member 11.

(Step (IIa'))

Subsequently, by raising the expansion ring 12 and pushing the dicing tape 3 upward with the laminate 6' in a cooled state, the dicing tape 3 is expanded radially (step (IIa')). There are no particular limitations on the cooling method, and in one example, a cooling stage 10' fitted with a cooling device is provided inside the expansion ring 12, and cooling is performed using the cooling stage 10'. By bringing the laminate 6' into close proximity with, or into contact with, the cooling stage 10', the temperature of the laminate 6' is lowered to a temperature lower than room temperature, and the laminate 6' is placed in a cooled state.

The temperature of the upper surface of the cooling stage 10' is preferably set within the same range as that described above for the temperature of the upper surface of the expansion stage 10 in the second embodiment.

(Step (IIb'))

Following the step (IIa') the raised expansion ring 12 is lowered, and the expanded dicing tape 3 is loosened (step (IIb')).

(Step (IIc'))

Subsequently, by raising the expansion ring 12 and pushing the dicing tape 3 upward with the laminate in a cooled state, the dicing tape 3 is expanded radially. As a result, the semiconductor wafer 1 and the die bonding film 2 are divided into chips 7 along the intended cutting lines 4, and the spaces between the chips are widened (step (IIc')). The cooling method is the same as that described above for the step (IIa').

Step (IId'))

Following the step (IIc'), a step may be provided for maintaining the expanded state of the dicing tape 3 (step (IId')).

Fourth Embodiment

The fourth embodiment relates to a method for manufacturing a semiconductor device comprising: a step (I) of preparing a laminate having a semiconductor wafer in which modified sections have been formed along intended cutting lines, a die bonding film and a dicing tape; a step (II) of expanding the dicing tape, dividing the semiconductor wafer and the die bonding film into chips along the intended cutting lines, and widening the spaces between the chips; a step (III) of picking up a chip from the dicing tape; and a step (IV) of die bonding the chip to an adherend, wherein the step (I) and the step (II) are performed using the expansion method of one of the embodiments described above.

The present embodiment has the steps (I) to (IV) in this order. The embodiment may also include other optional steps before or after each step, such as a step of detaching a protective sheet, a transport step, an inspection or verification step, a wire bonding step, or a molding step. The step (I) and the step (II) are the same as the aforementioned steps (I) to (IIC), steps (Ia) to (IIc), or steps (Ia') to (IIc').

(Step (III))

Figure 10:
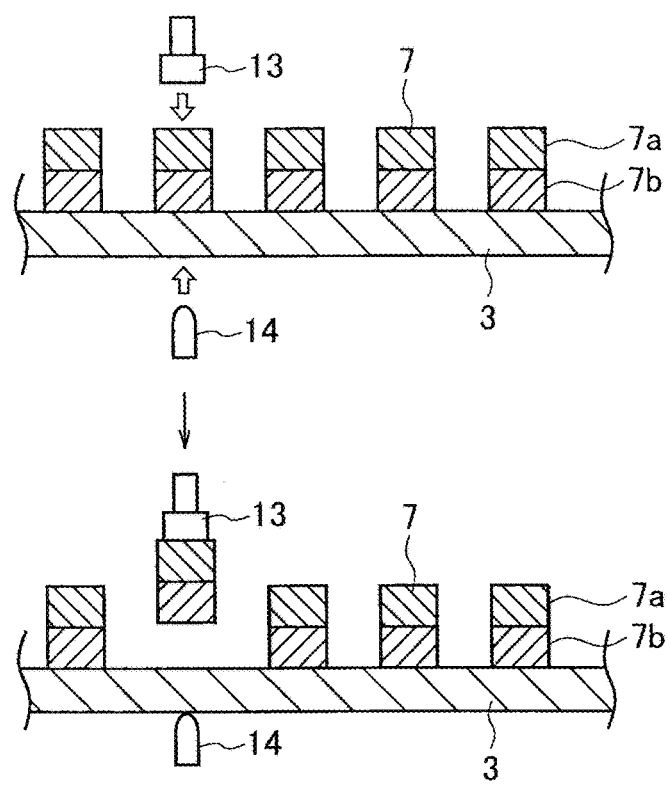
FIG. 10 is a schematic diagram illustrating one embodiment of a step of picking up a chip from the dicing tape.

Following division of the semiconductor wafer 1 and the die bonding film 2 into chips, a chip 7 is picked up from the dicing tape 3 (step (III)). FIG. 10 is a schematic diagram illustrating an embodiment of this pickup step. In FIG. 10, a collet 13 and a needle 14 are used to detach the chip 7 from the dicing tape 3, thus obtaining a single chip 7 (a semiconductor chip 7a and an individual piece of the die bonding film 7b bonded to the semiconductor chip).

When an ultraviolet-curable adhesive is used for the dicing tape, the dicing tape may be irradiated with ultraviolet light prior to performing the step (III) to cure the ultraviolet-curable adhesive. This reduces the adhesive strength between the dicing tape and the die bonding film, enabling the detachment between the dicing tape and the die bonding film to proceed more easily.

(Step (IV))

Figure 11:
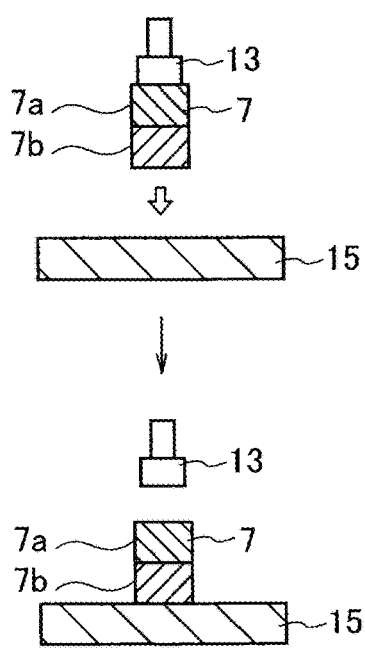
FIG. 11 is a schematic diagram illustrating one embodiment of a step of die bonding a chip to an adherend.

Next, the chip 7 is die bonded to an adherend 15 (step (IV)). FIG. 11 is a schematic diagram illustrating an embodiment of this die bonding step. In FIG. 11, the collet 13 is used to mount the chip 7 on the adherend 15 so that the die bonding film 7b contacts the adherend 15. Following mounting of the chip 7 on the adherend 15, the die bonding film is usually heated and cured.

According to this embodiment, a semiconductor device can be manufactured efficiently via simple steps, without using any special equipment, and without requiring any complex steps.

Fifth Embodiment

The fifth embodiment relates to a semiconductor device having an adherend, and a chip bonded to the adherend, wherein the semiconductor device is manufactured using the method for manufacturing a semiconductor device according to the embodiment described above.

Examples of the adherend include a semiconductor chip-mounting support member, or another semiconductor chip or the like. Specific examples of the semiconductor device include a semiconductor device in which at least one semiconductor chip is mounted to a semiconductor chip-mounting support member, and the semiconductor chip and the semiconductor chip-mounting support member are bonded together via a die bonding film (FIG. 12), and a semiconductor device in which at least two semiconductor elements are mounted on a semiconductor chip-mounting support member, and the semiconductor chip-mounting support member and a semiconductor chip, and the two semiconductor chips are bonded together via die bonding films (FIG. 13).

Examples of the semiconductor chip-mounting support member include lead frames such as a 42-alloy lead frame or a copper lead frame, plastic films formed from a polyimide resin or an epoxy resin or the like, plastics such as a polyimide resin or an epoxy resin that have been reinforced with a glass non-woven cloth base material, ceramics such as alumina, organic substrates having an organic resist layer provided on the surface, and organic substrates with wiring formed thereon. Here, the term "organic substrate" mainly means a substrate composed of an organic material such as a resin, a thermoplastic resin or a thermosetting resin, which has been reinforced with glass fiber.

Figure 12:
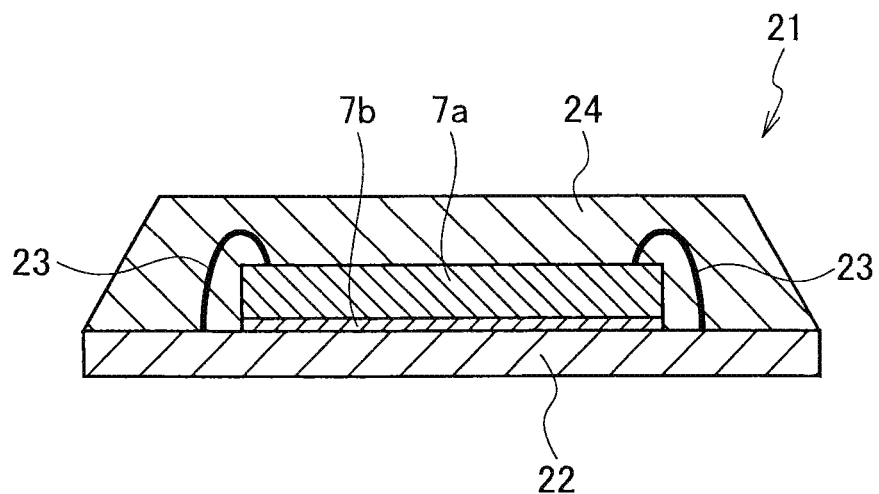
FIG. 12 is a schematic diagram illustrating one embodiment of a semiconductor device.

FIG. 12 is a schematic cross-sectional view illustrating one embodiment of the semiconductor device. In the semiconductor device 21 illustrated in FIG. 12, a semiconductor chip 7a is bonded to a semiconductor chip-mounting support member 22 via a die bonding film 7b. The connection terminals (not shown in the figure) of the semiconductor chip 7a are connected electrically to external connection terminals (not shown in the figure) via wires 23. Moreover, the semiconductor chip 7a and the wires 23 and the like are encapsulated by a sealing material 24.

Figure 13:
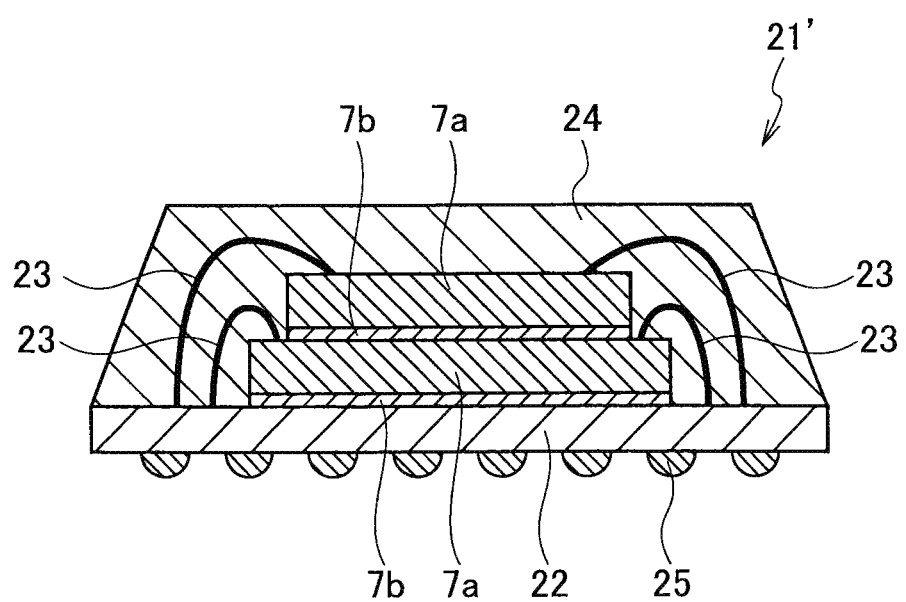
FIG. 13 is a schematic diagram illustrating one embodiment of a semiconductor device.

FIG. 13 is a schematic cross-sectional view illustrating another embodiment of the semiconductor device. The semiconductor device 21' illustrated in FIG. 13 is a 3D-packaged semiconductor device (Stacked-PKG) having a structure in which a plurality of semiconductor chips 7a are laminated on top of a semiconductor chip-mounting support member 22. In FIG. 13, the semiconductor chip 7a of the first level is bonded to the semiconductor chip-mounting support member 22 via a die bonding film 7b. Another semiconductor chip 7a is then bonded on top of the first semiconductor chip 7a via a die bonding film 7b. Moreover, the entire structure is encapsulated by a sealing material 24. The connection terminals (not shown in the figure) of the semiconductor chips 7a are connected electrically to external connection terminals 25 via wires 23.

The semiconductor device of the present embodiment can be manufactured efficiently via simple manufacturing steps, using a commercially available die bonding film.

Embodiments of the present invention have been described above with reference to the drawings, but the present invention is in no way limited by the embodiments described above. For example, in the second embodiment and the third embodiment described above, examples were presented in which the dicing tape was expanded by raising an expansion stage or an expansion ring, but the dicing tape may instead be expanded by lowering a fastening member which is capable of fastening the frame. Further, in each of the embodiments, the shapes and materials and the like of the members described above such as the laminate, the expansion stage, the expansion ring and the fastening member can be altered as applicable.

EXAMPLE

Next, the invention is described based on a series of examples, but the present invention is in no way limited by these examples.

Example 1

A die bonding film (DAF) (thermosetting epoxy resin-containing adhesive, thickness: 20 μM, diameter 335 mm) having a removable base material (polyethylene terephthalate film, thickness: 38 μm), and a dicing tape (DCT) composed of a base film (polyolefin-based film, thickness: 80 μm, diameter: 370 mm) and an adhesive (pressure-sensitive adhesive, thickness: 20 μm) were bonded together so that the die bonding film and the adhesive made contact, thus obtaining a dicing-die bonding integrated sheet.

[Evaluation]

Figure 14B:
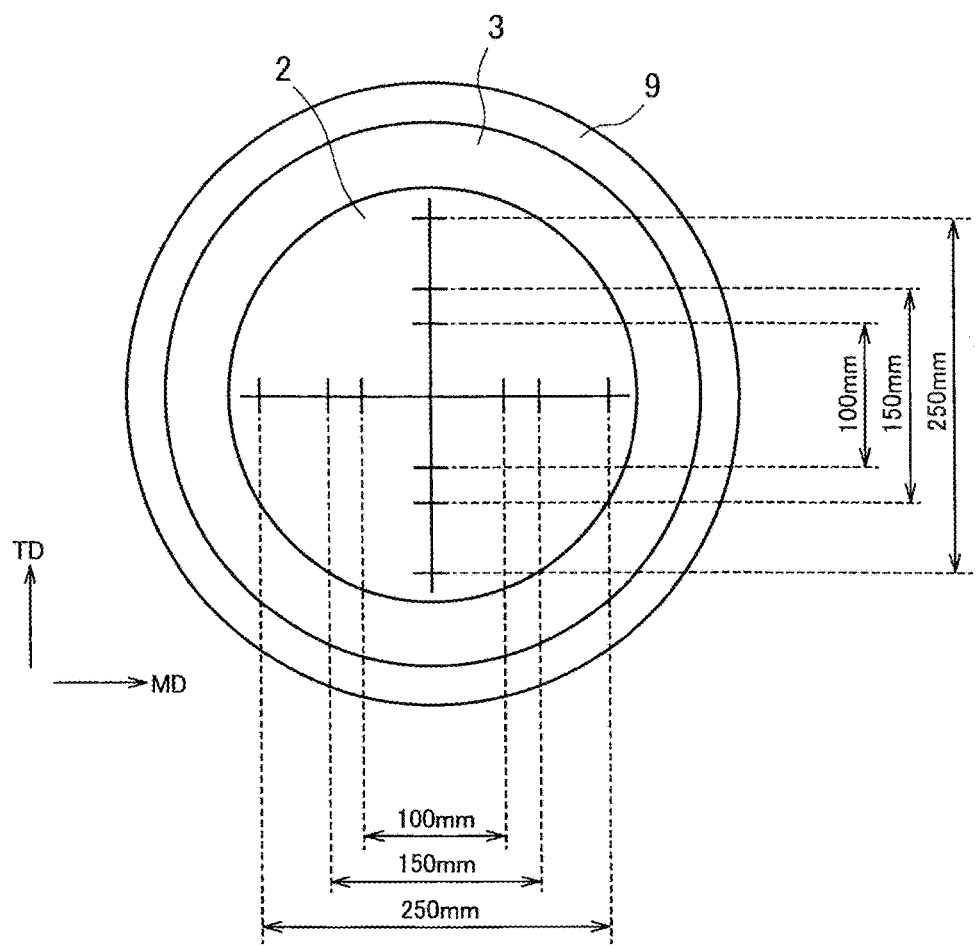
FIG. 14B is a schematic diagram illustrating a dicing-die bonding integrated sheet used in evaluations in Example 1 and Comparative Example 1.

Using the thus obtained dicing-die bonding integrated sheet, the extensibility of the dicing tape when cooled was evaluated. FIG. 14B illustrates a schematic plan view of the dicing-die bonding integrated sheet used in the evaluation. Following removal of the removable base material, a ring-shaped frame (inner diameter: 350 mm) was affixed to the dicing-die bonding integrated sheet.

Using a permanent marker pen, marks were made at locations 50 mm, 75 mm and 125 mm from the center of the dicing-die bonding integrated sheet in the MD direction (Machine Direction, the flow direction of the film) of the base film. For each distance, two marks were made at locations on either side of the center. Accordingly, the distance between each set of two marks was 100 mm, 150 mm and 250 mm respectively. These distances represent the "length before expansion".

Similarly, a permanent marker pen was also used to make marks at locations 50 mm, 75 mm and 125 mm from the center of the dicing-die bonding integrated sheet in the TD direction (Transverse Direction, the width direction of the film) of the base film.

An expansion was performed using the same method as that illustrated in steps (IIa) to (IIc) of FIGS. 6A and 6B, but with the exception of not laminating a semiconductor wafer to the dicing-die bonding integrated sheet. Specifically, the dicing tape was expanded using an expansion apparatus (manufactured by Hitachi Chemical Co., Ltd.) having a height-adjustable expansion stage (diameter: 345 mm) equipped with a cooling device, and a fastening member capable of fastening the ring-shaped frame. When fastening the ring-shaped frame using the fastening member, the center of the dicing-die bonding integrated sheet was aligned with the center of the expansion stage. Because a semiconductor wafer was not used, the die bonding film was not cut, but was rather expanded together with the dicing tape.

The expansion conditions were as follows.

Step (IIa):
  Raising distance setting for expansion stage: 8 mm ($h_1$)
  Raising speed setting for expansion stage: 100 mm/second
  Temperature of upper surface of expansion stage: −10° C.
  Surface temperature of dicing-die bonding integrated sheet: −10° C.

Step (IIb):
  Dicing tape loosening time: 1 second

Step (IIc):
  Raising distance setting for expansion stage: 15 mm ($h_2$)
  Raising speed setting for expansion stage: 100 mm/second
  Temperature of upper surface of expansion stage: 0° C.
  Surface temperature of dicing-die bonding integrated sheet: 0° C.

The temperature of the upper surface of the expansion stage and the surface temperature of the dicing-die bonding integrated sheet were measured using a laser thermometer ("Non-Contact Radiation Thermometer", manufactured by A&D Co., Ltd.).

After performing the step (IIc), the distance between each set of two marks across the center of the dicing-die bonding integrated sheet was measured (0.5 mm increments) for both the MD direction and the TD direction. These distances represent the "length after expansion". Using the "length before expansion" and the "length after expansion", the amount of expansion and the expansion ratio were determined. The evaluation results are shown in Table 1.

The amount of expansion [mm], in both the MD direction and the TD direction, was the value determined by calculating "(length after expansion [mm])−(length before expansion [mm])", and the average amount of expansion represents the arithmetic mean of the amounts of expansion in the MD direction and the TD direction. Further, the expansion ratio [%], in both the MD direction and the TD direction, was the value determined by calculating "(amount of expansion [mm])/(length before expansion [mm])×100", and the average expansion ratio represents the arithmetic mean of the expansion ratios in the MD direction and the TD direction.

Comparative Example 1

With the exception of altering the expansion method, the extensibility of a dicing tape was evaluated in the same manner as Example 1. In Comparative Example 1, the expansion was performed in accordance with the method illustrated in step (ii) of FIG. 18, but with the exception of not laminating a semiconductor wafer to the dicing-die bonding integrated sheet. Specifically, the dicing tape was expanded using an expansion apparatus (manufactured by Hitachi Chemical Co., Ltd.) having a height-adjustable expansion stage equipped with a cooling device, and a fastening member capable of fastening the ring-shaped frame.

The expansion conditions were as follows.

Step (ii):
  Raising distance setting for expansion stage: 15 mm
  Raising speed setting for expansion stage: 100 min/second
  Temperature of upper surface of expansion stage: 0° C.
  Surface temperature of dicing-die bonding integrated sheet: 0° C.

TABLE 1

| | Surface temperature of integrated sheet [° C.] | Raising distance setting for stage [mm] | Length before expansion | | Length after expansion | | Amount of expansion (expansion ratio) | | |
|---|---|---|---|---|---|---|---|---|---|
| | | | MD [mm] | TD [mm] | MD [mm] | TD [mm] | MD [mm] (MD [%]) | TD [mm] (TD [%]) | average [mm] (average [%]) |
| Example 1 | (IIa): −10 (IIc): 0 | (IIa): 8 (IIc): 15 | 100 | 100 | 102 | 102 | 2.0 (2.0) | 2.0 (2.0) | 2.0 (2.0) |
| | | | 150 | 150 | 152 | 152.5 | 2.0 (1.3) | 2.5 (1.7) | 2.3 (1.5) |
| | | | 250 | 250 | 254.5 | 254 | 4.5 (1.8) | 4.0 (1.6) | 4.3 (1.7) |
| Comparative Example 1 | (ii): 0 | (ii): 15 | 100 | 100 | 101 | 101 | 1.0 (1.0) | 1.0 (1.0) | 1.0 (1.0) |
| | | | 150 | 150 | 150.5 | 151.5 | 0.5 (0.3) | 1.5 (1.0) | 1.0 (0.7) |
| | | | 250 | 250 | 252 | 251.5 | 2.0 (0.8) | 1.5 (0.6) | 1.8 (0.7) |

As shown in Table 1, by using the expansion method according to the embodiment of the present invention, the extensibility of the dicing tape was able to be increased.

Example 2

A dicing-die bonding integrated sheet was obtained in the same manner as Example 1. Further, a silicon wafer (thickness: 50 μm, diameter: 300 mm) was processed with a laser dicing saw "DFL7360" (manufactured by DISCO Corporation) in accordance with the laser processing conditions described above, thus obtaining a silicon wafer having modified sections formed along intended cutting lines (spacing between lines: 10 mm) Subsequently, the dicing-die bonding integrated sheet from which the removable base material had been removed was affixed to the silicon wafer so that the die bonding film and the rear surface of the silicon wafer made contact. Moreover, a ring-shaped frame (inner diameter: 350 mm) was affixed to the dicing-die bonding integrated sheet to obtain a laminate such as that illustrated in FIG. 8.

[Evaluation]

Figure 15:
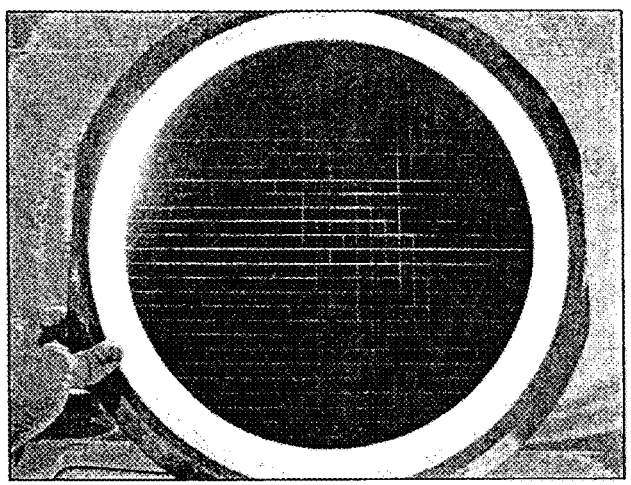
FIG. 15 is a photograph illustrating a semiconductor wafer following expansion in Example 2.

Using the thus obtained laminate, the divisibility of the semiconductor wafer and the die bonding film was evaluated. The evaluation results are shown in Table 2. A photograph of the semiconductor wafer is shown in FIG. 15.

An expansion was performed using the same method as that illustrated in steps (IIa) to (IIc) of FIGS. 6A and 6B. Specifically, the dicing tape was expanded using an expansion apparatus "Die Separator DDS2300" (manufactured by Disco Corporation) having a height-adjustable expansion stage (diameter: 330 mm) equipped with a cooling device, and a fastening member capable of fastening the ring-shaped frame. When fastening the ring-shaped frame using the fastening member, the center of the semiconductor wafer was aligned with the center of the expansion stage. After the expansion, the portions of the dicing tape positioned outside the semiconductor wafer were heat shrunk (dicing tape temperature: 80° C.).

The expansion conditions were as follows.

Step (IIa):
 Raising distance setting for expansion stage: 8 mm ($h_1$)
 Raising speed setting for expansion stage: 100 mm/second
 Temperature of upper surface of expansion stage: −10° C.

Step (IIb):
 Dicing tape loosening time: 1 second

Step (IIc):
 Raising distance setting for expansion stage: 12 mm ($h_2$)
 Raising speed setting for expansion stage: 100 mm/second
 Temperature of upper surface of expansion stage: −10° C.

The temperature of the upper surface of the expansion stage was measured using a laser thermometer ("Non-Contact Radiation Thermometer", manufactured by A&D Co., Ltd.).

After performing the step (IIc), the cutting ratio for the semiconductor wafer and the die bonding film was evaluated. The cutting ratio [%] for the semiconductor wafer and the die bonding film was determined by calculating "(number of cut lines)/(total number of lines)×100". Here, the "total number of lines" is the combined total of all of the intended cutting lines, and the "number of cut lines" is the total number of lines in which the semiconductor wafer has divided along the entire length of the intended cutting line and a kerf width of at least 10 μm has been obtained.

Example 3

Figure 16:
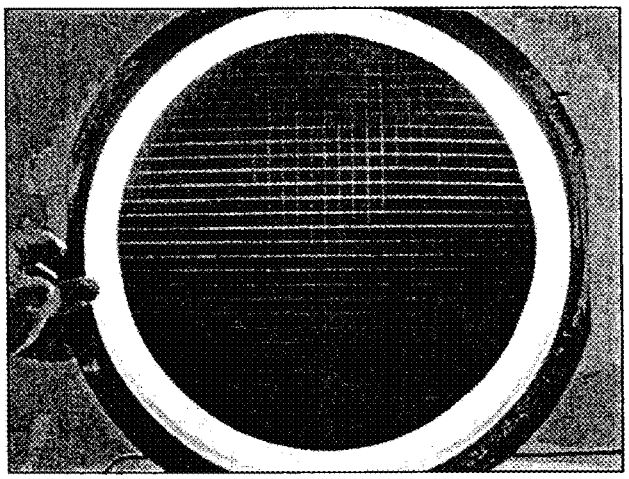
FIG. 16 is a photograph illustrating a semiconductor wafer following expansion in Example 3.

With the exception of altering the expansion conditions, a dicing tape was expanded, and a semiconductor wafer and a die bonding film were divided and evaluated in the same manner as that described for Example 2. The evaluation results are shown in Table 2, and a photograph of the semiconductor wafer is shown in FIG. 16.

The expansion conditions were as follows.

Step (IIa):
 Raising distance setting for expansion stage: 8 mm ($h_1$)
 Raising speed setting for expansion stage: 100 mm/second
 Temperature of upper surface of expansion stage: −10° C.

Step (IIIb):
 Dicing tape loosening time: 1 second

Step (IIc):
 Raising distance setting for expansion stage: 15 mm ($h_2$)
 Raising speed setting for expansion stage: 100 mm/second
 Temperature of upper surface of expansion stage: −10° C.

Comparative Example 2

Figure 17:
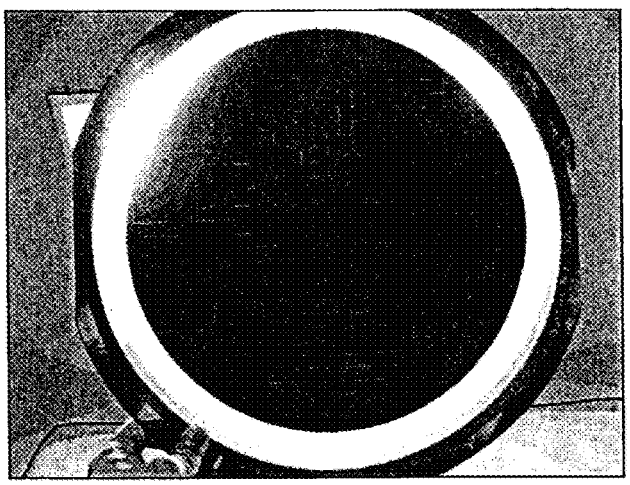
FIG. 17 is a photograph illustrating a semiconductor wafer following expansion in Comparative Example 2.

With the exception of altering the expansion method, a dicing tape was expanded, and a semiconductor wafer and a die bonding film were divided and evaluated in the same manner as that described for Example 2. In Comparative Example 2, the expansion was performed in accordance with the method illustrated in step (ii) of FIG. 18. The evaluation results are shown in Table 2, and a photograph of the semiconductor wafer is shown in FIG. 17.

The expansion conditions were as follows.

Step (ii):

Raising distance setting for expansion stage: 15 mm

Raising speed setting for expansion stage: 100 mm/second

Temperature of upper surface of expansion stage: −10° C.

TABLE 2

|  | Temperature of upper surface of stage [° C.] | Raising distance setting for stage [mm] | Cutting ratio [%] |
|---|---|---|---|
| Example 2 | (IIa): −10 (IIc): −10 | (IIa): 8 (IIc): 12 | 57 |
| Example 3 | (IIa): −10 (IIc): −10 | (IIa): 8 (IIc): 15 | 87 |
| Comparative Example 2 | (ii): −10 | (ii): 15 | 37 |

As shown in Table 2, by using the expansion method according to an embodiment of the present invention, the cutting ratio for the semiconductor wafer and the die bonding film was able to be increased. By using the expansion method according to an embodiment of the present invention, the semiconductor wafer and the die bonding film were able to be divided with good yield, enabling a semiconductor device to be manufactured with good efficiency.

REFERENCE SIGNS LIST

1: Semiconductor wafer
1*a*: Surface on which circuit is formed
1*b*: Surface on which no circuit is formed
2: Die bonding film
3: Dicing tape
4: Intended cutting line
5: Modified section
6, 6': Laminate
7: Chip
7*a*: Semiconductor chip
7*b*: Individual piece of die bonding film
8: Dicing-die bonding integrated sheet
9: Frame
10: Expansion stage
10': Cooling stage
11: Fastening member
12: Expansion ring
13: Collet
14: Needle
15: Adherend
21, 21': Semiconductor device
22: Semiconductor chip-mounting support member
23: Wire
24: Sealing material
25: External connection terminal
O: Center of die bonding film
A, B: Mark
$L_1$: Length before expansion
$L_2$: Length after expansion
$h_1$: Raising distance for expansion stage (step (IIa))
$h_2$: Raising distance for expansion stage (step (IIc))

The invention claimed is:

1. An expansion method comprising at least one method selected form the group consisting of a method (i) and a method (ii), wherein
the method (i) comprises:
a step (Ia) of preparing a laminate having a semiconductor wafer in which modified sections have been formed along intended cutting lines, a die bonding film, a dicing tape and a frame,
a step (Ib) of supplying the laminate to a height-adjustable expansion stage of an expansion apparatus comprising the expansion stage and a fastening member capable of fastening the frame,
a step (Ic) of fastening the frame using the fastening member,
a step (IIa) of raising the expansion stage and expanding the dicing tape with the laminate in a cooled state,
a step (IIb) of lowering the raised expansion stage and loosening the expanded dicing tape, and
a step (IIc) of raising the expansion stage lowered in the step (IIb) and expanding the dicing tape with the laminate in a cooled state, dividing the semiconductor wafer and the die bonding film into chips along the intended cutting lines, and widening spaces between the chips, and
the method (ii) comprises:
a step (Ia') of preparing a laminate having a semiconductor wafer in which modified sections have been formed along intended cutting lines, a die bonding film, a dicing tape and a frame,
a step (Ib') of supplying the laminate to a height-adjustable expansion ring of an expansion apparatus comprising the expansion ring and a fastening member capable of fastening the frame,
a step (Ic') of fastening the frame using the fastening member,
a step (IIa') of raising the expansion ring and expanding the dicing tape with the laminate in a cooled state,
a step (IIb') of lowering the raised expansion ring and loosening the expanded dicing tape, and
a step (IIc') of raising the expansion ring lowered in the step (IIb') and expanding the dicing tape with the laminate in a cooled state, dividing the semiconductor wafer and the die bonding film into chips along the intended cutting lines, and widening spaces between the chips.

2. The expansion method according to claim 1 comprising the method (ii).

3. The expansion method according to claim 1, wherein expansion of the dicing tape is performed by applying an external force to the dicing tape, and an external force applied to the dicing tape in the step (IIc) is greater than an external force applied to the dicing tape in the step (IIa), and an external force applied to the dicing tape in the step (IIc') is greater than an external force applied to the dicing tape in the step (IIa').

4. A method for manufacturing a semiconductor device comprising:
a step (I) of preparing a laminate having a semiconductor wafer in which modified sections have been formed along intended cutting lines, a die bonding film, a dicing tape and a frame,
a step (II) of expanding the dicing tape, dividing the semiconductor wafer and the die bonding film into chips along the intended cutting lines, and widening spaces between the chips,
a step (III) of picking up a chip from the dicing tape, and a step (IV) of die bonding the chip to an adherend, wherein
the step (I) and the step (II) are performed using the expansion method according to claim 1.

5. A semiconductor device having an adherend, and a chip bonded to the adherend, wherein the semiconductor device is manufactured using the method for manufacturing a semiconductor device according to claim 4.

6. The expansion method according to claim 1, wherein the cooled state in the step (IIa) is from −15° C. to 10° C., the cooled state in the step (IIc) is from −15° C. to 10° C., the cooled state in the step (IIa') is from −15° C. to 10° C., and the cooled state in the step (IIc') is from −15° C. to 10° C.

7. The expansion method according to claim 1 comprising the method (i).

* * * * *